US006400594B2

United States Patent
Hata et al.

(10) Patent No.: US 6,400,594 B2
(45) Date of Patent: Jun. 4, 2002

(54) CONTENT ADDRESSABLE MEMORY WITH POTENTIALS OF SEARCH BIT LINE AND/ OR MATCH LINE SET AS INTERMEDIATE POTENTIAL BETWEEN POWER SOURCE POTENTIAL AND GROUND POTENTIAL

(75) Inventors: Ryuichi Hata; Naoki Kanazawa; Hideaki Iwasaki, all of Mihama-ku; Masato Yoneda, Ichihara, all of (JP)

(73) Assignee: Kawasaki Steel Corporation, Chiba (JP)

( * ) Notice: Subject to any disclaimer, the term of this patent is extended or adjusted under 35 U.S.C. 154(b) by 0 days.

(21) Appl. No.: 09/795,139

(22) Filed: Mar. 1, 2001
Prior Publication Data
US 2001/0026464 A1 Oct. 4, 2001

(Under 37 CFR 1.47)

(30) Foreign Application Priority Data

Mar. 3, 2000 (JP) ......................................... 2000-058569
Jan. 19, 2001 (JP) ......................................... 2001-011005

(51) Int. Cl.$^7$ ............................................... G11C 15/00
(52) U.S. Cl. ...................... 365/49; 365/189.07; 365/203
(58) Field of Search ............................... 365/49, 189.06, 365/203, 189.08, 189.07

(56) References Cited

U.S. PATENT DOCUMENTS 5,602,770 A * 2/1997 Ohira ........................... 365/49
5,852,569 A * 12/1998 Srinivasan et al. ........... 365/49
6,307,798 B1 * 10/2001 Ahmed et al. .............. 365/207
6,320,777 B1 * 11/2001 Lines et al. .................... 365/49

* cited by examiner

*Primary Examiner*—Richard Elms
*Assistant Examiner*—Hien Nguyen
(74) *Attorney, Agent, or Firm*—Oliff & Berridge, PLC

(57) ABSTRACT

A content addressable memory device includes a storage bit line pair for reading storage data from and writing storage data to a content addressable memory cell, a search bit line pair, wired independently from the storage bit line pair, for providing search data to the content addressable memory cell, and a first unit for realizing a smaller swing in the level of the search bit line pair by setting the potential of the search bit line pair to an intermediate potential between a power source potential and a ground potential during match searching, and/or a second unit for realizing a smaller swing in the level of a match line by setting a precharge level of the match line to the intermediate potential between the power source potential and the ground potential.

23 Claims, 17 Drawing Sheets

CONTENT ADDRESSABLE MEMORY WITH POTENTIALS OF SEARCH BIT LINE AND/OR MATCH LINE SET AS INTERMEDIATE POTENTIAL BETWEEN POWER SOURCE POTENTIAL AND GROUND POTENTIAL

BACKGROUND OF THE INVENTION

1. Field of the Invention

The present invention relates to a technology for reducing the power consumption in a content addressable memory device.

2. Description of the Related Art

FIG. 17 shows one example of a content addressable memory (hereinafter, referred to as a CAM) device. In the figure, a CAM device 118 includes a CAM cell array 120 having an N bit width×M word construction, a decoder 122, a bit line control circuit 124, a match detecting circuit 126, a flag generator 128, and a priority encoder 130. Although not shown, the bit line control circuit 124 includes a bit line precharge circuit, a bit line driver, a sense amplifier, a search data register, a mask register, and the like.

In the CAM device 118, storage data is read and written in the same manner as in a normal RAM. That is, when data is written, the decoder 122 selects a word WL corresponding to an address ADR. The bit line driver drives data DATA as storage data on a bit line BIT and negated data /DATA (the negated signal of data DATA) as storage data on a bit bar line /BIT. The driven data is written in the word WL corresponding to the address ADR.

When data is read, the decoder 122 selects the word WL corresponding to the address ADR. This allows DATA (the storage data) to be read on the bit line and the /DATA to be read on the bit bar line. Thereafter, the sense amplifier detects the read data, and the storage data stored in the word WL corresponding to the address ADR is read as DATA.

Match searching of search data is performed on storage data as follows. After storage data is written to each word of the CAM cell array 120 in the above-described manner, the search data is input as DATA, instructing the start of search. By loading the search data in the search data register, and then driving the search data DATA on the bit line BIT and its negated signal /DATA on the bit bar line /BIT, match searching of the search data is performed on the storage data of every word.

The match detecting circuit 126 corresponding to each word via a match line ML detects a search result. The detected data is input to the flag generator 128 and the priority encoder 130. The flag generator 128 outputs, as a flag, one state of "no matching", "single matching", and "multiple matching" in accordance with the result. When matching occurs, the priority encoder 130 outputs the memory address of the matched word having a predetermined high priority as a high priority hit address (HHA).

Match searching of the CAM device 118 is described in more detail by giving examples of the CAM cell shown in FIGS. 18A to 18C. The CAM cells shown in these figures are constructed using a SRAM (static random access memory).

In a CAM cell 132 shown in FIG. 18A, match searching is performed by setting the bit line BIT and the bit bar line /BIT to LOW, turning off an N-type MOS (Metal Oxide Semiconductor) transistor 138 (hereinafter, referred to as an NMOS) which is connected between the match line ML and the ground, precharging the potential of the match line ML to the potential of a power source, and driving the search data DATA on the bit line BIT and the search data bar /DATA on the bit bar line /BIT.

When the storage data and the search data match, the gate of the NMOS 138 is maintained at LOW via either an NMOS 134 or an NMOS 136 which is turned on in accordance with the storage data. Therefore, the match line ML remains precharged. However, when the storage data and the search data do not match, a HIGH level signal is input into the gate of the NMOS 138 via either the NMOS 134 or the NMOS 136 which is turned on. Since this turns on the NMOS 138, the match line ML is discharged.

In a CAM cell 140 shown in FIG. 18B, match searching is performed by setting the bit line BIT and the bit bar line /BIT to LOW, turning off an NMOS 146 and an NMOS 148, which are connected to the ground, precharging the potential of the match line ML to the potential of the power source, and then driving the search data DATA on the bit line BIT and the search data bar /DATA on the bit bar line /BIT.

When the storage data and the search data match, either an NMOS 142 or the NMOS 146 is turned off and either an NMOS 144 or the NMOS 148 is turned off in which a pair of the NMOSs 142 and 146 and a pair of the NMOSs 144 and 148 are individually connected in series between the match line ML and the ground. Accordingly, the match line ML remains precharged. When the storage data and the search data do not match, both the NMOS 142 and the NMOS 146 or both the NMOS 144 and the NMOS 148 are turned on. This allows the match line ML to be discharged via the NMOS transistors, both of which are turned on.

In a CAM cell 150 shown in FIG. 18C, match searching is performed by setting the bit line BIT and the bit bar line /BIT to HIGH, turning off two P-type MOS transistors (hereinafter, referred to as a PMOS) 156 and 158, which are connected to the match line ML, discharging the match line ML to the ground potential, and then driving the search data DATA on the bit line BIT and the search data bar /DATA on the bit bar line /BIT.

When the storage data and the search data match, either a PMOS 152 or the PMOS 156 is turned off and either a PMOS 154 or the PMOS 158 is turned off in which a pair of the PMOSs 152 and 156 and a pair of the PMOSs 154 and 158 are individually connected in series between the match line ML and the power source. Accordingly, the match line ML remains discharged. On the other hand, when the storage data and the search data do not match, both the PMOS 152 and the PMOS 156 or both PMOS 154 and the PMOS 158 are turned on. This allows the match line ML to be charged via the PMOS transistors both of which are turned on.

In the case of the CAM device 118 shown in FIG. 17, one word is constructed using N CAM cells, the CAM cells which constitute the same word are connected to the match line ML. Accordingly, the match line ML is maintained at a standby level only when matching is detected on all of the CAM cells constituting the one word. When mismatching is detected in any of the CAM cells constituting the one word, the match line ML is discharged from the standby potential.

The CAM cells 132, 140, and 150 shown in FIGS. 18A to 18C are mismatch-detecting types. When mismatching occurs, the match line ML is discharged/charged so that the logical level of the match line ML becomes the opposite logical level of the precharge potential. However, since storage data of most words are mismatched, when the mismatch-detecting type CAM cells shown in FIGS. 18A to 18C are used, the potentials of most match lines ML are discharged/charged to the opposite logical level of the precharge potential. This means that the potentials of most match lines ML swing from the power source potential to the ground potential every searching cycle.

In the case of each of the CAM cells 132 and 140 in FIGS. 18A and 18B, respectively, the following steps must be executed in order to perform match searching. After normal storage data is read or written, a bit line pair of the bit line BIT and the bit bar line /BIT is precharged to the power source potential during the standby time. During match searching, the bit line pair is discharged to the ground potential and then the match line ML is precharged to the power source potential. Thereafter, either the bit line BIT or the bit bar line /BIT is driven to the power source potential again in accordance with the search data.

That is, in order to precharge the potential of the match line ML, the bit line pair of BIT and /BIT must be temporarily discharged to the ground potential. The amount of current required for these precharging and discharging is dissipated. On the other hand, in the case of the CAM cell 150 in FIG. 18C, the match line ML is discharged, and then either BIT or /BIT of the bit line pair which is precharged to the power source potential is discharged to the ground potential.

Thus, since most match lines ML and the bit line pairs of BITs and /BITs are simultaneously precharged/discharged during searching, the increase in power consumption becomes a problem as the capacity of the CAM device and the processing speed increase. However, in principle, the CAM device must simultaneously compare the search data with all of the storage data. Therefore, unlike the normal RAM, reduction in power consumption cannot be achieved by performing block division, bank division, or the like in the memory arrays so that searching is performed only on the selected block or the selected bank.

SUMMARY OF THE INVENTION

Accordingly, it is an object of the present invention to provide a low-power CAM device having higher capacity and faster processing speed by solving the foregoing problems.

To this end, according to a first aspect of the present invention, there is provided a consumption content addressable memory device including a storage bit line pair for reading storage data from and writing storage data to a content addressable memory cell, a search bit line pair, wired independently from the storage bit line pair, for providing search data to the content addressable memory cell, and a first unit for realizing a smaller swing in the level of the search bit line pair by setting the potential of the search bit line pair to an intermediate potential between a power source potential and a ground potential during match searching.

According to a second aspect of the present invention, a content addressable memory device includes a storage bit line pair for reading storage data from and writing storage data to a content addressable memory cell, a search bit line pair, wired independently from the storage bit line pair, for providing search data to the content addressable memory cell, and a second unit for realizing a smaller swing in the level of a match line by setting a precharge level of the match line to an intermediate potential between a power source potential and a ground potential, wherein the match line outputs a result of match searching of the storage data for the search data.

According to a third aspect of the present invention, a content addressable memory device includes a storage bit line pair for reading storage data from and writing storage data to a content addressable memory cell, a search bit line pair, wired independently from the storage bit line pair, for providing search data to the content addressable memory cell, a first unit for realizing a smaller swing in the level of the search bit line pair by setting the potential of the search bit line pair to an intermediate potential between a power source potential and a ground potential during match searching, and a second unit for realizing a smaller swing in the level of a match line by setting a precharge level of the match line to an intermediate potential between the power source potential and the ground potential, wherein the match line outputs a result of match searching of the storage data for the search data.

In CAM, among the storage bit line and the search bit line, the search bit line has much more responsibility for power consumption during charging and discharging. This is because only the storage bit lines corresponding to a selected column are activated during storage data reading and writing while all search bit lines to be searched must be activated during searching. In the present invention, the level of the storage bit line may be swung from the ground potential to the power source potential same as in a conventional manner. Alternatively, the level of the storage bit line may be swung based on the intermediate potential in the same manner as the level of the search bit line. However, by causing the storage bit line to be operated between the ground potential and the power source potential, power consumption of CAM can be greatly reduced while the processing speeds and the stabilities of the reading/writing operations are maintained.

Further objects, features and advantages of the present invention will become apparent from the following description of the preferred embodiments with reference to the attached drawings.

DESCRIPTION OF THE PREFERRED EMBODIMENTS

Figure 1:
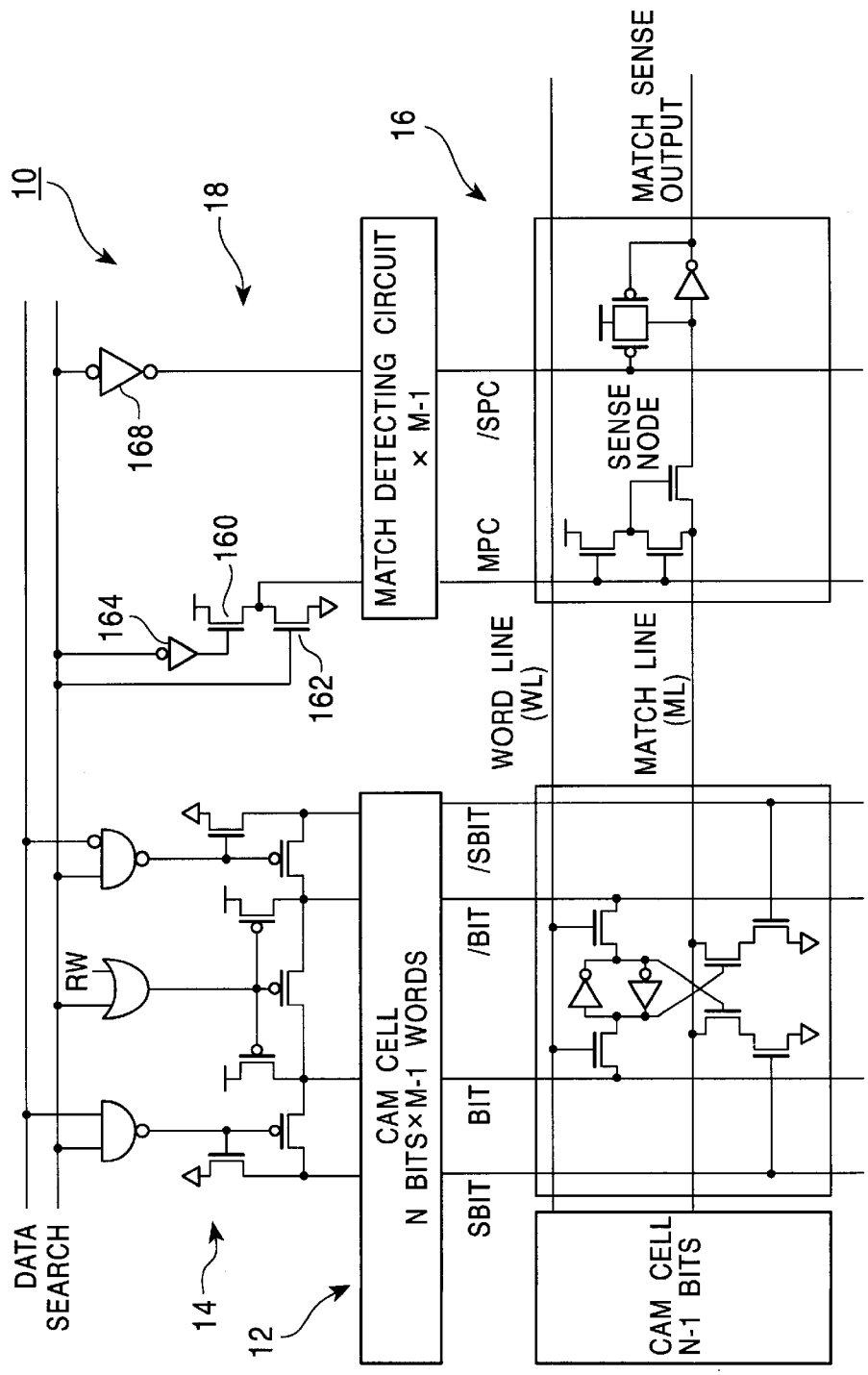
FIG. 1 is a block diagram of a CAM device according to an embodiment of the present invention.

FIG. 1 shows only the characteristic parts of a CAM device 10 according to the present invention. The CAM device 10 includes a CAM cell array 12, a bit line control circuit 14, a match detecting circuit 16, and a charge line control circuit 18. Since other components of the CAM device 10 are known, they are not shown.

The CAM cell array 12 is constructed by arranging N bit width×M word CAM cells in an array manner. As shown specifically in FIG. 2, the CAM cell 20 includes a storage portion 22 storing one-bit data and a search portion 24 comparing one-bit data stored in the storage portion 22 with search data. A storage bit line BIT and a storage bit bar line /BIT of a storage bit line pair and a search bit line SBIT and a search bit bar line /SBIT of a search bit line pair are independently connected to the CAM cell 20.

The storage portion 22, which is constructed using a known SRAM cell, includes inverters 26 and 28 connected in a ring manner in which the input of one thereof is connected to the output of the other thereof, an NMOS 30 connected between the input of the inverter 26 and the storage bit line BIT, and an NMOS 32 connected between the input of the inverter 28 and the storage bit bar line /BIT. The gates of the two NMOSs 30 and 32 are commonly connected to a word line WL.

The search portion 24 includes NMOSs 34, 36, 38, and 40. The NMOSs 34 and 38 are connected in series between the match line ML and the ground line, and the corresponding gates thereof are connected to the output terminal of the inverter 26 of the storage portion 22 and the search bit line SBIT. In the same manner, the NMOSs 36 and 40 are connected in series between the match line ML and the ground line, and the corresponding gates thereof are connected to the output of the inverter 28 of the storage portion 22 and the search bit bar line /SBIT.

Figure 18A:
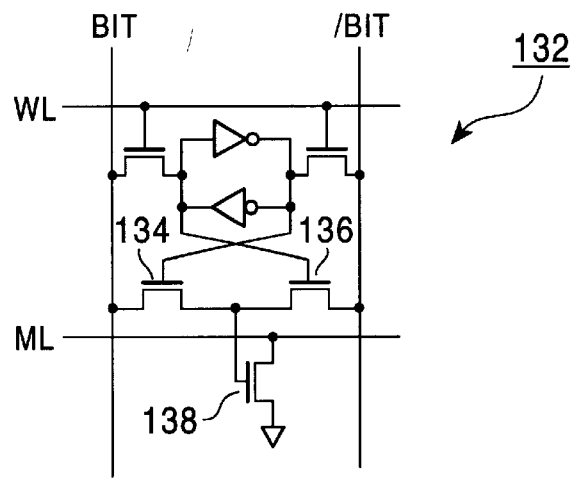
FIGS. 18A, 18B, and 18C are circuit diagrams of examples of the CAM cells.
Figure 18B:
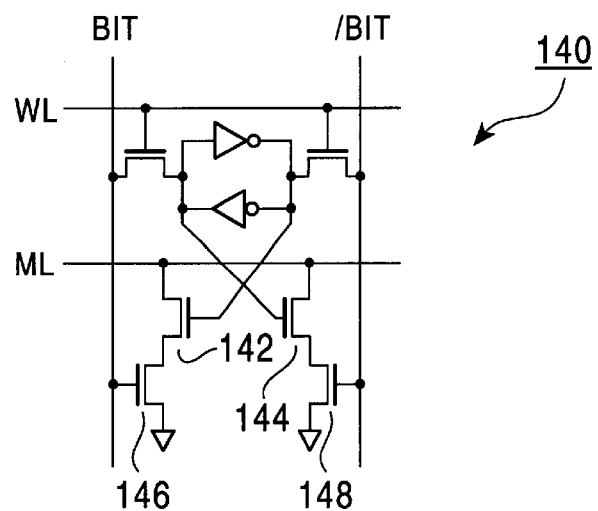
Figure 18C:
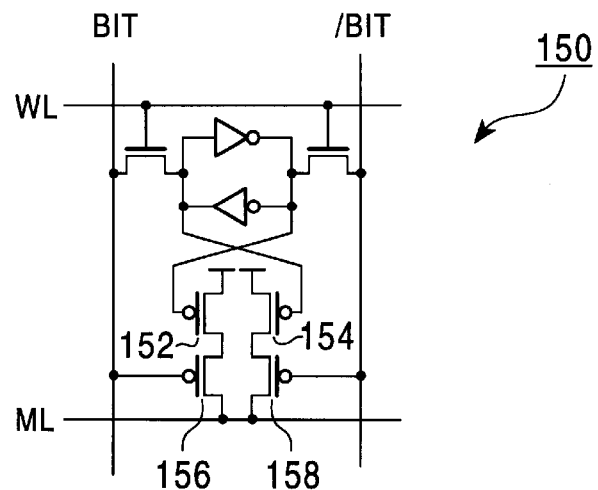

Operations of the CAM cell 20 are substantially the same as those of the CAM cell 140 shown in FIG. 18B. However, in the CAM cell 20, BIT and /BIT of the storage bit line pair and SBIT and /SBIT of the search bit line pair are independently wired. Therefore, during the standby time, the potential of the storage bit line BIT and the potential of the storage bit bar line /BIT can be set to the power source potential, and the potential of the search bit line SBIT and the potential of the search bit bar line /SBIT can be set to the ground potential.

In the CAM cell 20, since SBIT and /SBIT of the search bit line pair are independently wired, the load capacity of the search bit line pair of SBIT and /SBIT is reduced by half. Accordingly, even though the CAM device 10 has a larger capacity, the amount of dissipated current can also be reduced by half during match searching. This reduction in the load capacity results in high-speed operation. As described below, instead of full swings of the levels of SBIT and /SBIT of the search bit line pair, small swings of the levels thereof can be allowed.

Even though SBIT and /SBIT of the search bit line pair are independently wired, no substantial increase in the layout area is anticipated due to multilayer metal wiring. The CAM cell is not limited to the example shown in FIG. 2. Any type of conventional CAM cell may be used. For example, although the SRAM is used to construct the storage portion 22 in this example, DRAM (Dynamic Random Access Memory) or various types of ROM (Read Only Memory) may be used. The construction of the search portion 24 is not limited, either.

In the CAM device 10, during match searching, the bit line control circuit 14 precharges the potentials of SBIT and /SBIT of the search bit line pair provided for the CAM cell array 12 to intermediate potentials. This is realized by independently wiring the search bit line pair. Bit line control circuits are described with reference to FIGS. 3A and 3B.

Figure 3A:
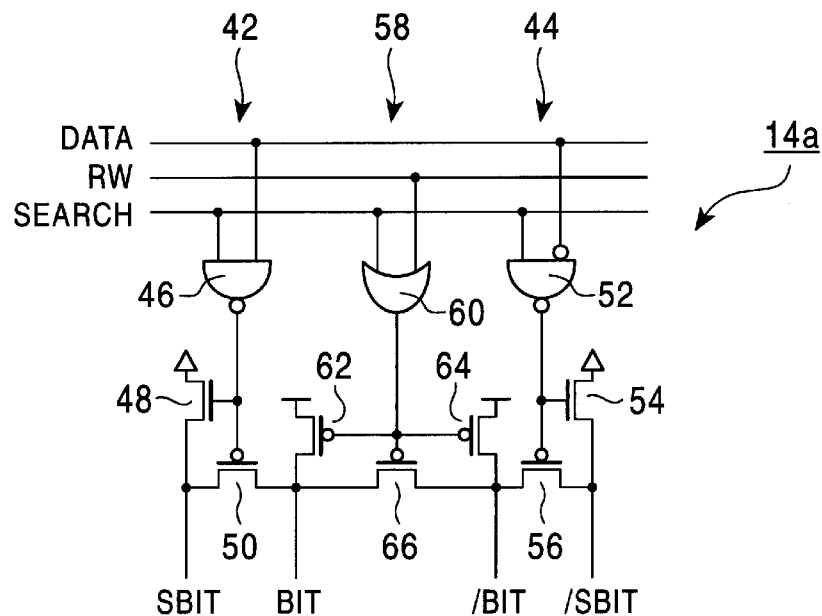
FIGS. 3A and 3B are circuit diagrams of bit line control circuits according to embodiments of the present invention.
Figure 3B:
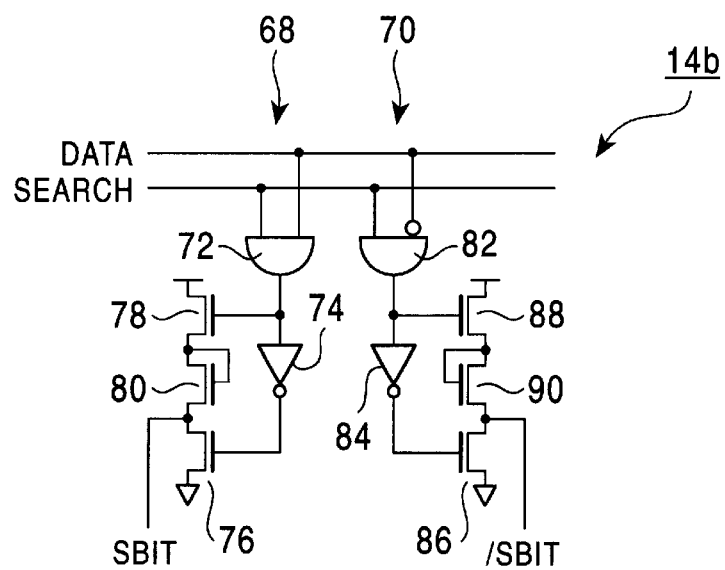

A bit line control circuit 14a shown in FIG. 3A, includes a search bit line SBIT control circuit 42 having a NAND gate 46, a discharging NMOS 48, and an equalizing PMOS 50 and a search bit bar line /SBIT control circuit 44 having a NAND gate 52, a discharging NMOS 54, and an equalizing PMOS 56.

In the control circuit 42, signals DATA and SEARCH are input into two corresponding inputs of the NAND gate 46 and the output thereof is connected to the gates of the NMOS 48 and the PMOS 50. The NMOS 48 is connected between the search bit line SBIT and the ground, and the PMOS 50 is connected between the search bit line SBIT and the storage bit line BIT.

In the control circuit 44, the signals DATA and SEARCH are input to the negated input terminal and the other input terminal of the NAND gate 52, respectively, and the output terminal thereof is connected to the gates of the NMOS 54 and the PMOS 56. The NMOS 54 is connected between the search bit bar line /SBIT and the ground and the PMOS 56 is connected between the search bit bar line /SBIT and the storage bit bar line /BIT.

The bit line control circuit 14a further includes a control circuit 58 of the storage bit line pair of the BIT and /BIT having an OR gate 60, precharging PMOSs 62 and 64, and an equalizing PMOS 66.

In the control circuit 58, signals RW and SEARCH are input to the two corresponding inputs of the OR gate 60 and the output thereof is connected to the gates of the PMOSs 62, 64, and 66. The PMOS 62 is connected between the power source and the storage bit line BIT, the PMOS 64 is connected between the power source and the storage bit bar line /BIT, and the PMOS 66 is connected between the storage bit line BIT and the storage bit bar line /BIT.

The signal SEARCH instructs the start of match searching. During match searching, the signal SEARCH is HIGH; and during the standby time, the signal SEARCH is LOW. The signal DATA drives the search bit line pair of SBIT and /SBIT. The signal RW instructs the storage data to be read (R) or to be written (W): during reading and writing, the signal RW is HIGH; and during the standby time, the signal RW is LOW.

In the bit line control circuit 14a, the signals SEARCH and RW are set to LOW during the standby time.

As a result, the output signal of the OR gate 60 of the control circuit 58 becomes LOW, which turns on the PMOSs 62, 64, and 66. This causes the storage bit line pair of the BIT and /BIT to be precharged to the power source potential via the PMOSs 62, 64, and 66.

The output of the NAND gate 46 of the control circuit 42 becomes HIGH, which turns on the NMOS 48 and turns off the PMOS 50. That is, the PMOS 50 electrically isolates the search bit line SBIT from the storage bit line BIT, discharging the search bit line SBIT to the ground potential via the NMOS 48.

In the same manner, the output of the NAND gate 52 of the control circuit 44 becomes HIGH, which turns on the NMOS 54 and turns off the PMOS 56. That is, the PMOS 56 electrically isolates the search bit bar line /SBIT from the storage bit bar line /BIT, discharging the search bit bar line /SBIT to the ground potential via the NMOS 54.

During match searching, the signal DATA becomes HIGH when the signal DATA drives the search bit line SBIT to be HIGH (in other words, the search bit bar line /SBIT to be LOW) in accordance with the search data; the signal DATA becomes LOW when the signal DATA drives the search bit line SBIT to be LOW (in other words, the search bit bar line /SBIT to be HIGH). The signal SEARCH becomes HIGH.

At this time, the output of the OR gate 60 of the storage control circuit 58 is HIGH, which turns off the PMOSs 62, 64, and 66. Accordingly, this causes the storage bit line pair of the BIT and /BIT to be in a floating-HIGH state of the power source potential to which the power source potential is precharged during the standby time.

When the signal DATA is HIGH, the output of the NAND gate 46 of the control circuit 42 is LOW, which turns off the NMOS 48 and turns on the PMOS 50. This establishes an electrical connection between SBIT and BIT via the PMOS 50. When the load capacitances of SBIT and BIT are equal, their potentials are as HIGH as one-half the power source potential.

In the control circuit 44, since the output signal of the NAND gate 52 is maintained at HIGH, the search bit bar line /SBIT remains discharged to the ground potential via the NMOS 54. When the signal DATA is LOW, the states of the search bit line SBIT and the search bit bar line /SBIT are reversed.

In the bit line control circuit 14a, during the standby time, the storage bit line pair of BIT and /BIT is HIGH, and the search bit line pair of SBIT and /SBIT is LOW. During match searching, the potential of one of SBIT and /SBIT is set to an intermediate potential between the power source potential and the ground potential while the potential of the other is maintained at LOW by forming a short-circuit either between the search bit line SBIT and the storage bit line BIT or between the search bit bar line /SBIT and the storage bit bar line /BIT.

Another example of the bit line control circuit is described. The bit line control circuit 14b shown in FIG. 3B includes a control circuit 68 of the search bit line SBIT having an AND gate 72, an inverter 74, a discharging NMOS 76, and intermediate potential generating NMOSS 78 and 80, and a control circuit 70 of the search bit bar line /SBIT having an AND gate 82, an inverter 84, a discharging NMOS 86, and intermediating potential generating NMOSs 88 and 90.

In the control circuit 68, the signals DATA and SEARCH are input into the two corresponding input terminals of the AND gate 72, and the output terminal of the AND gate 72 is connected to the gate of the NMOS 78 and the input terminal of the inverter 74. The NMOS 76 is connected between the search bit line SBIT and the ground. The NMOSs 78 and 80 are connected in series between the power source and the search bit line SBIT. The gate of the NMOS 80 is connected to the source of the NMOS 78.

In the control circuit 70, the signals DATA and SEARCH are input to the negated input terminal and the other input terminal of the AND gate 82, respectively. The output terminal of the AND gate 82 is connected to the gate of the NMOS 88 and the input terminal of the inverter 84. The output terminal of the inverter 84 is connected to the gate of the NMOS 86. The NMOS 86 is connected between the search bit bar line /SBIT and the ground, and the NMOSs 88 and 90 are connected in series between the power source and the search bit bar line /SBIT. The gate of the NMOS 90 is connected to the source of the NMOS 88.

During the standby time, the signal SEARCH is LOW; in the control circuits 68 and 70, the outputs of the AND gates 72 and 82 are LOW, the outputs of the inverters 74 and 84 are HIGH, the NMOSs 76 and 86 are turned on, and the potentials of SBIT and /SBIT are discharged to the ground potential. During match searching, the signal DATA becomes either HIGH or LOW in accordance with the search data and then the signal SEARCH becomes HIGH.

When the signal DATA of HIGH is applied to the control circuit 68, the output of the AND gate 72 becomes HIGH, which causes the output of the inverter 74 to become LOW. This turns on the NMOSs 78 and 80 and turns off the NMOS 76. Accordingly, the level of the search bit line SBIT is HIGH, which level is the sum of the threshold voltages $V_{th}$ of the NMOSs 78 and 80 below a power source $V_{DD}$, that is, an intermediate voltage $V_{DD}-2V_{th}$.

Since the output of the AND gate 82 is maintained at LOW, the control circuit 70 of the search bit bar line /SBIT causes the search bit bar line /SBIT to remain discharged to the ground via the NMOS 86. When the applied signal DATA is LOW, the state of the search bit line SBIT and the state of the search bit bar line /SBIT are reversed.

In the bit line control circuit 14b, during the standby time, SBIT and /SBIT are LOW. During match searching, an intermediate potential is generated by dropping the potential of the power source in accordance with the number of intermediate potential generating NMOSS. Thus, setting the HIGH levels of SBIT and /SBIT to the intermediate potential between the power source potential and the ground potential allows dissipated current during match searching to be decreased.

Alternatively, the construction of the bit line control circuit 14a or 14b may be changed so that the power source and the ground are switched, the polarity of each internal signal is inverted, and the N-type MOS transistors and the P-type MOS transistors are switched.

When this change is applied to the bit line control circuit 14a, during the standby time, the storage bit line pair of the BIT and /BIT is LOW, the search bit line pair of SBIT and /SBIT is HIGH. During match searching, by short-circuiting either between the search bit line SBIT and the storage bit line BIT or between the search bit bar line /SBIT and the storage bit bar line /BIT, the potential of one of SBIT and /SBIT is set to an intermediate potential between the power source potential and the ground potential while the other thereof is maintained at the potential of the power source.

In the bit line control circuit 14b, during the standby time, the search bit line pair of SBIT and /SBIT is HIGH; and during match searching, an intermediate potential is generated by raising the ground potential in accordance with the number of intermediate potential generating PMOSs.

In the CAM device 10 shown in FIG. 1, there are provided M match detecting circuits 16 which individually correspond to the words of the CAM cell array 12. A charge transfer amplifier is used in accordance with a control of the charging line control circuit 18 to sense the level of the match line ML after match searching and then amplifying-outputs the sensed level as a match sense output.

The present invention is characterized in that the precharge potential of the match line ML during the standby time is between the power source potential and the ground potential.

Figure 4A:
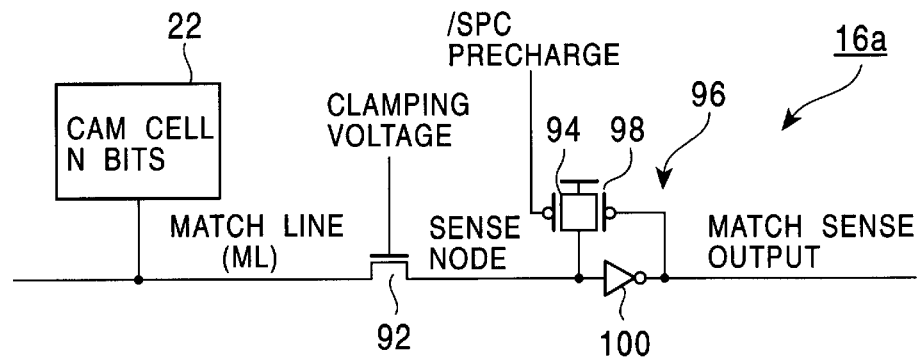
FIGS. 4A, 4B, and 4C are circuit diagrams of match detecting circuits according to embodiments of the present invention.
Figure 4B:
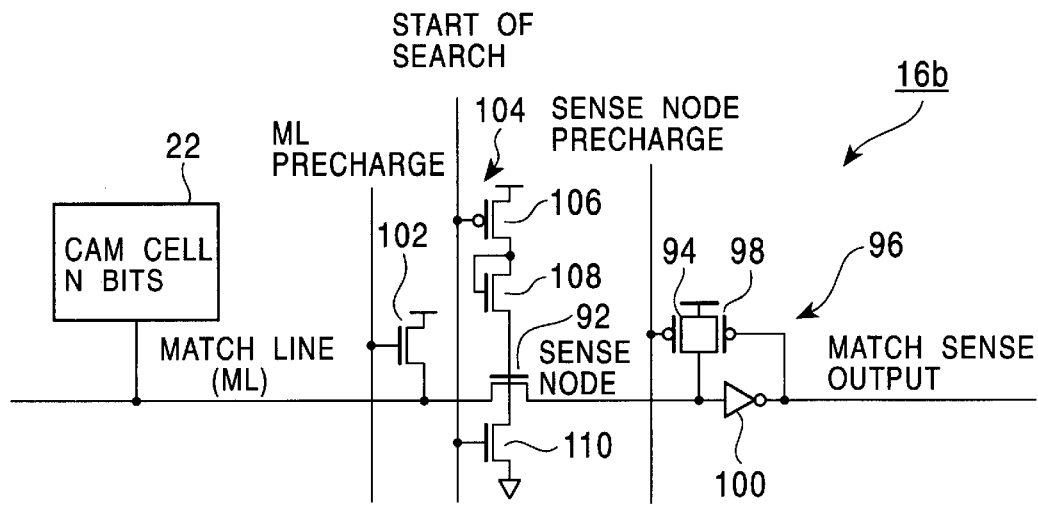
Figure 4C:
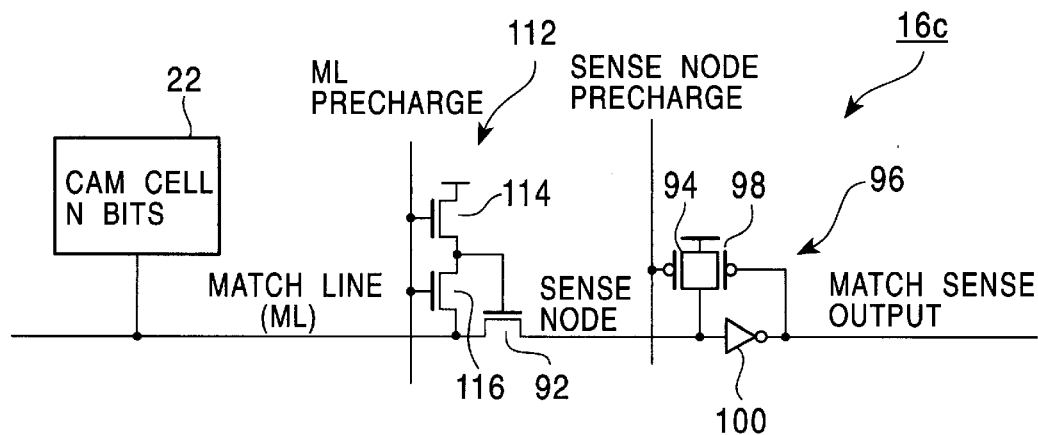

FIGS. 4A to 4C show the constructions of examples of the match detecting circuit 16.

A match detecting circuit 16a shown in FIG. 4A includes an NMOS 92 serving as the charge transfer amplifier, a PMOS 94 that is a precharge circuit of a sense node, and a match sense output circuit 96 having a PMOS 98 and an inverter 100. N CAM cells 22 are connected to the match line ML in which N corresponds to the number of bits of a word.

Since the present invention realizes the match line ML having a smaller level swing by setting the precharge potential of the match line ML to the intermediate potential, the NMOS 92, which serves as the charge transfer amplifier, is provided at the input side of the inverter 100 for accelerating match searching.

A clamping voltage is applied to the gate of the NMOS 92 which is connected between the match line ML and the sense node. The inverter 100 is connected between the sense node and the match sense output line. The PMOS 94 and the PMOS 98 are connected in parallel between the power source and the sense node, and the gates thereof are connected to a precharge line /SPC (see FIG. 1) of the sense node and the output terminal of the inverter 100, respectively.

In the match detecting circuit 16a, during the standby time, setting the precharge line to LOW (the signal SEARCH becomes LOW) turns on the PMOS 94. This allows the sense node to be precharged to the power source potential via the PMOS 94. Accordingly, the output of the match sense output circuit 96 is LOW by causing the inverter 100 to invert the HIGH output of the sense node. Since the LOW output of the match sense output circuit 96 turns on the PMOS 98, the PMOS 98 also causes the sense node to be precharged to the potential of the power source.

At this point, for example, when the clamping voltage is the power source, application of the clamping voltage turns on the NMOS 92 allowing the PMOSs 94 and 98 to precharge the potential of the match line ML via the NMOS 92. When the potential of the match line ML is precharged to the potential that is the threshold voltage $V_{th}$ of the NMOS 92 below the power source $V_{DD}$, the NMOS 92 is turned off.

Thereafter, when the precharge line is set to HIGH, the PMOS 94 is turned off while the match line ML is maintained at the potential of the floating high $V_{DD}-V_{th}$. In addition, the sense node and the match sense output are maintained at their current states because the PMOS 98 causes the sense node to be maintained at the precharged state.

When mismatch occurs as a result of match searching and then the potential of the match line ML becomes below the precharge potential $V_{DD}-V_{th}$ (the voltage $V_{gs}$ across the gate and the source of the NMOS 92>the threshold voltage $V_{th}$), the NMOS 92 is turned on.

The load capacitance of the match line ML is considerably larger than that of the sense node. Accordingly, because of the amplifying effect of the sense node, electric charge that is precharged in the sense node is rapidly pulled via the NMOS 92 towards the match line ML, causing the potentials of the match line ML and the potential of the sense node to be identical. When any decrease from the threshold value of the inverter 100 in the potential of the sense node occurs, HIGH is output as the match sense output.

When the potential of the match line ML drops below $V_{DD}-V_{th}$, the NMOS 92 is turned on, allowing the potential of sense node and the potential of the match line ML to be identical. Therefore, acceleration of match searching is achieved.

The match detecting circuit 16a sets the clamping voltage so that the clamping voltage is lower than the power source voltage $V_{DD}$. This enables the precharge potential of the match line ML during the standby time to be an intermediate value, that is, theoretically, the threshold value of the NMOS 92+α. For example, when the clamping voltage is set to $V_{DD}-V_{th}$, the potential of the match line ML is precharged to $V_{DD}-2V_{th}$. Realization of small level swing of the match line ML can reduce the amount of dissipated current in the match line ML during match searching.

In the match detecting circuit 16a, precharging is performed using the NMOS 92, which serves as the charge transfer amplifier. For example, when a high-speed operation such as a precharging time reducing operation is executed, the NMOS 92 is not turned off in a case in which the match line ML is not fully precharged. There is a possibility that electric charge of the sense node may flow into the match line ML after completion of precharge time, producing a malfunction. Moreover, even though the match line ML is fully precharged, since $V_{gs}=V_{th}$, the noise margin is low.

A match detecting circuit 16b shown in FIG. 4B solves the above noise margin problem of the match detecting circuit 16a shown in FIG. 4A. The noise margin is improved by reducing the precharge time. The match detecting circuit 16b is constructed by providing the match detecting circuit 16a with a NMOS 102, which is an ML precharge circuit, and a clamping-voltage generating circuit 104. The clamping-voltage generating circuit 104 includes a PMOS 106 and two NMOSs 108 and 110 that are connected in series between the power source and the ground.

The NMOS 102 is connected between the power source and the match line, and the gate thereof is connected to a ML precharge line. The gates of the PMOS 106 and NMOS 110 of the clamping-voltage generating circuit 104 are commonly connected to the start of search line. The gate of the NMOS 108 is connected to the drain of the PMOS 106. The connection node of the NMOSs 108 and 110 is connected to the gate of the NMOS 92 as the clamping voltage. originally, the clamping-voltage generating circuit 104 properly functions by providing with only the NMOS 108, so that the clamping-voltage generating circuit 104 is controlled using the start of search line. However, in order to prevent the clamping voltage from exceeding a predetermined voltage ($V_{DD}-V_{th}$ in the present embodiment) due to coupling of the gate-drain voltage $V_{gd}$ of the NMOS 108, there are further provided the NMOS 110 allowing the clamping voltage to be discharged to the ground potential and the PMOS 106 provided between the power source and the NMOS 108.

The match detecting circuit 16b separately drives the precharge potential of the match line ML and the clamping voltage of the NMOS 92, serving as the charge transfer amplifier, to be charged to the same potential. In FIG. 4B, during the standby time, the potential of the match line ML is precharged to $V_{DD}-V_{th}$ (the potential of the power source–the threshold voltage of the NMOS 102) and the clamping voltage of the NMOS 92 is set to $V_{DD}-V_{th}$ (the power source–the threshold voltage of the NMOS 108).

Therefore, the match line ML can be quickly precharged via the NMOS 102. In addition, since the precharge potential of the match line ML and the clamping voltage of the NMOS 92 are both $V_{DD}-V_{th}$, a noise margin corresponding to the magnitude of $V_{th}$ can be provided in the match line ML during match searching.

When, for example, the match detecting circuit 16b operates at high speeds, the potential of the match line ML having a large load-capacity sometimes cannot be charged to $V_{DD}-V_{th}$ using a predetermined size of the NMOS 102 within a certain cycle in the same manner as in the match detecting circuit 16a shown in FIG. 4A. On the other hand, since the node of the clamping voltage of the NMOS 92 has little load capacitance, the clamping voltage is fully precharged to $V_{DD}-V_{th}$.

When, at the start of match searching after completion of precharge time, the potential of the match line ML is not fully precharged to $V_{DD}-V_{th}$ and when the difference between the clamping voltage and the potential of the match line ML is $V_{th}$ or above, the NMOS 92 is turned on. Accordingly, there is a risk that the same malfunction that occurs in the match detecting circuit 16a may occur. A match detecting circuit 16c shown in FIG. 4C solves this problem, thereby preventing generation of the voltage difference between the clamping voltage and the potential of the match line ML.

The match detecting circuit 16c is constructed by providing an ML precharge circuit 112 including two NMOSs 114 and 116 in the match detecting circuit 16a. The NMOSs 114 and 116 are connected in series between the power source and the match line ML, and the gates thereof are commonly connected to the ML precharge line. The connection node of these two NMOSs 114 and 116 is connected as the clamping voltage to the gate of the NMOS 92.

In the match detecting circuit 16c, for example, when the potential of the ML precharge line is equal to the potential of the power source $V_{DD}$, the potential of the match line ML is precharged to $V_{DD}-V_{th}$ via the two NMOSs 114 and 116 of the ML precharge circuit 112 during the standby time. The connection node of the NMOSS 114 and 116 is used as the clamping node and the potentials of the connection node are also $V_{DD}-V_{th}$.

When the match detecting circuit 16c operates at high speeds, the potential of the match line ML cannot be precharged to a predetermined voltage (in the present embodiment, $V_{DD}-V_{th}$) in accordance with the sizes (the driving capabilities) of the two NMOSs 114 and 116 of the ML precharge circuit 112 within a certain cycle. However, since the precharge potential of the match line ML and the clamping voltage are always the same in the match detecting circuit 16c, there is no risk of the occurrence of the malfunction.

In the same manner as in the match detecting circuit 16a, the match detecting circuit 16b enables the level of the clamping voltage of the NMOS 92 serving as the charge transfer amplifier to be adjusted by, for example, changing the number of series stages of NMOSs 108 in the clamping-voltage generating circuit 104. The match detecting circuit 16c enables the precharge level of the match line ML as well as the clamping-voltage level of the NMOS 92 to be adjusted by changing the HIGH level of the ML precharge line.

Alternatively, the match detecting circuits 16a to 16c may be constructed so that the power sources and the grounds are switched, the polarity of each internal signal is inverted, and the N-type MOS transistors and the P-type MOS transistors are switched.

Finally, in the CAM device 10 shown in FIG. 1, the charge line control circuit 18 adjusts the voltage level of the ML precharge line and the voltage level of the precharge line of the sense node of the match detecting circuit 16c. In the present invention, the actual circuit construction of the charge line control circuit 18 is not restricted.

The charge line control circuit 18 shown in FIG. 1 corresponds to the match detecting circuit 16c shown in FIG. 4C. The charge line control circuit 18 includes two NMOSs 160 and 162 connected in series between the power source and the ground, an inverter 164, and a buffer 166. The signal SEARCH is input to the input terminal of the inverter 164, the gate of the NMOS 162, and the input terminal of the buffer 166. The output terminal of the inverter 164 is connected to the gate of the NMOS 160. The connection node of the NMOSs 160 and 162 is output as the signal MPC and the output of the buffer 166 is output as the signal /SPC.

When the charge control circuit 18 is in the standby state, the signal SEARCH is LOW. Therefore, the NMOS 162 is turned off, and the output signal of the inverter 164 is HIGH, which turns on the NMOS 160. This causes the voltage level of the signal MPC to be $V_{DD}-V_{th}$ in which the power source voltage is $V_{DD}$ and the threshold voltage of the NMOS 160 is $V_{th}$. The output of the buffer 166 is LOW and the signal /SPC is LOW.

The voltage level of the ML precharge line of the match detecting circuit 16c shown in FIG. 4C can be adjusted by properly changing the voltage level of the signal MPC using the charge line control circuit 18. Accordingly, the precharge potential of the match line ML and the clamping voltage may be freely altered in accordance with the relationship between the required operation speed and the required power consumption.

Another embodiment of the CAM device according to the present invention is described.

Figure 5:
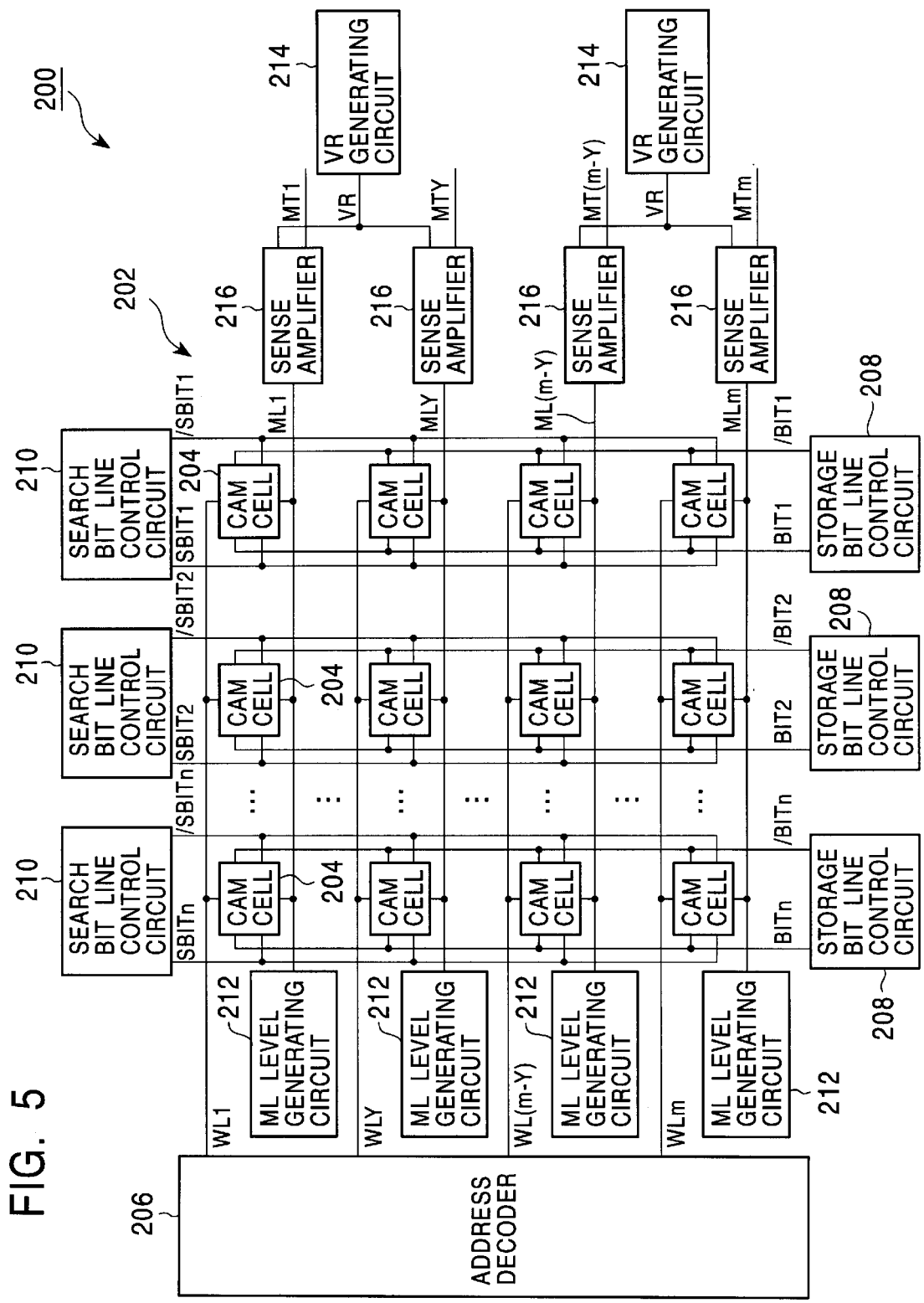
FIG. 5 is a block diagram of the CAM device according to another embodiment of the present invention.

FIG. 5 shows the construction of CAM according to this embodiment.

In FIG. 5, a CAM 200 sets the potential of the search bit line pair of SBIT and /SBIT and the potential of the match line ML to the intermediate potential during match searching. The CAM 200 includes a CAM cell array 202, an address decoder 206, a storage bit line control circuit 208, a search bit line control circuit 210, an ML level generating circuit 212, a reference voltage generating circuit 214, and a sense amplifier 216.

In the CAM 200, the CAM cell array 202 is constructed by arranging N bit width×M word CAM cells 204 in the same array manner as in the CAM cell array 12 of the CAM 10 shown in FIG. 1. Not only the CAM cell 20 shown in FIG. 2 but also various types of conventional CAM cell may be used as the CAM cell 204.

The address decoder 206 drives the word line WL corresponding to an externally input address signal when the storage data is read from or written to the CAM cell array 202. The storage bit line control circuit 208 drives the storage bit line pair of the BIT and the /BIT when the storage data is written to the word corresponding to the address signal. The address decoder 206 and the storage bit line control circuit 208 also may be constructed using various conventional circuits.

The search bit line control circuit 210 drives the search bit line pair of SBIT and /SBIT. The search bit control circuit 210 is characterized by precharging the potentials of SBIT and /SBIT to intermediate potentials between the power source potential and the ground potential during match searching. In other words, the potential swing is decreased by setting the potentials of SBIT and /SBIT to the intermediate potentials.

Concrete examples of the search bit line control circuit 210 are described with reference to FIGS. 6, 7, and 8.

Figure 6:
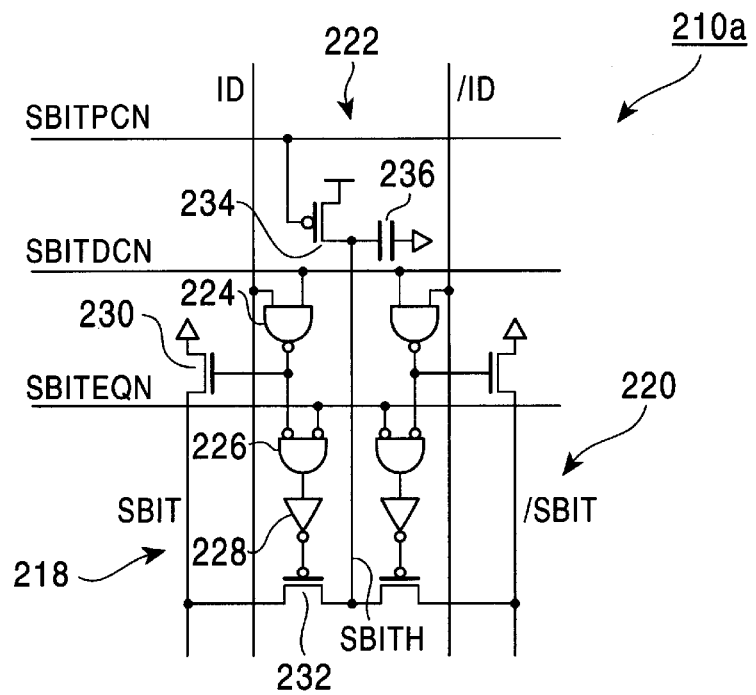
FIG. 6 is a circuit diagram of a search bit line control circuit according to one embodiment of the present invention.

A search bit line control circuit 210a shown in FIG. 6 sets the HIGH level potential of the search bit line pair of SBIT and /SBIT to an intermediate potential during match searching by charge sharing (capacitance division) between an internal node SBITH and one search bit line of the search bit line pair. The search bit line control circuit 210a includes a control circuit 218 of the search bit line SBIT, a control circuit 220 of the search bit bar line /SBIT, and a charge storage control circuit 222.

The control circuit 218 includes a NAND gate 224, an AND gate 226, an inverter 228, a discharging NMOS 230, and an equalizing PMOS 232.

Signals ID and SBITDCN are input to the corresponding two input terminals of the NAND gate 224, and the output terminal thereof is connected to the gate of the NMOS 230 and one negated input terminal of the AND gate 226. The other negated input terminal of the AND gate 226 is connected to a signal SBITEQN and the output thereof is connected to the gate of the PMOS 232 via the inverter 228. The NMOS 230 is connected between the search bit line SBIT and the ground, and the PMOS 232 is connected between the search bit line SBIT and the internal node SBITH.

The control circuit 220 of the search bit bar line /SBIT differs from the control circuit 218 of the search bit line SBIT in that the search bit bar line /SBIT and a signal /ID (obtained by inverting the signal ID) are provided instead of the search bit line SBIT and the signal ID. Other than these, the control circuit 220 has exactly the same construction as that of the control circuit 218. Accordingly, a description of the control circuit 220 is omitted.

The charge storage control circuit 222 includes the PMOS 234 and a capacitance component 236. The PMOS 234 is connected between the power source and the internal node SBITH and a signal SBITPCN is input to the gate of the PMOS 234. The capacitance component 236 is connected between the internal node SBITH and the ground.

Figure 16:
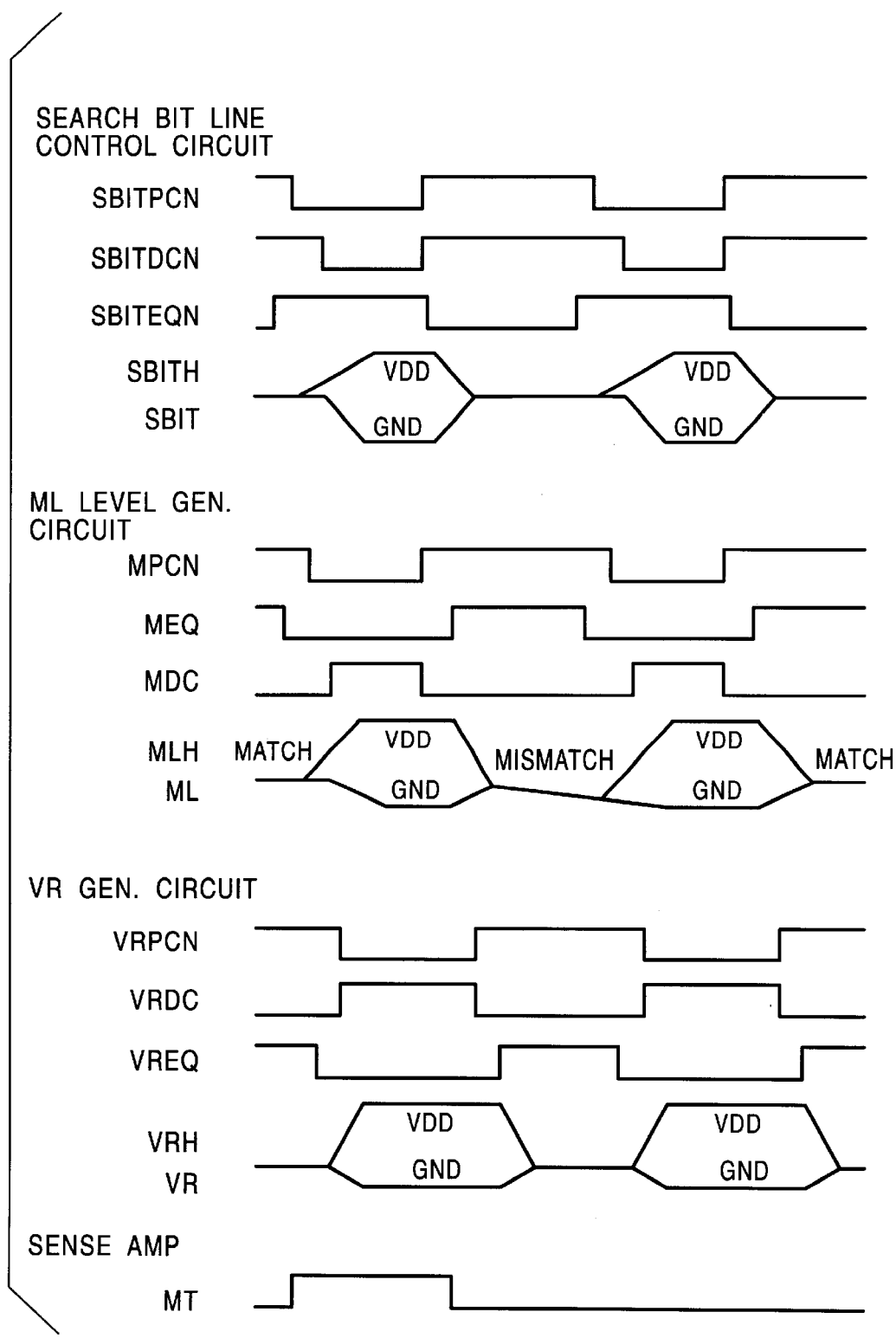
FIG. 16 is a timing chart indicating operations of the CAM device according to the present invention shown in FIG. 5.
Figure 17:
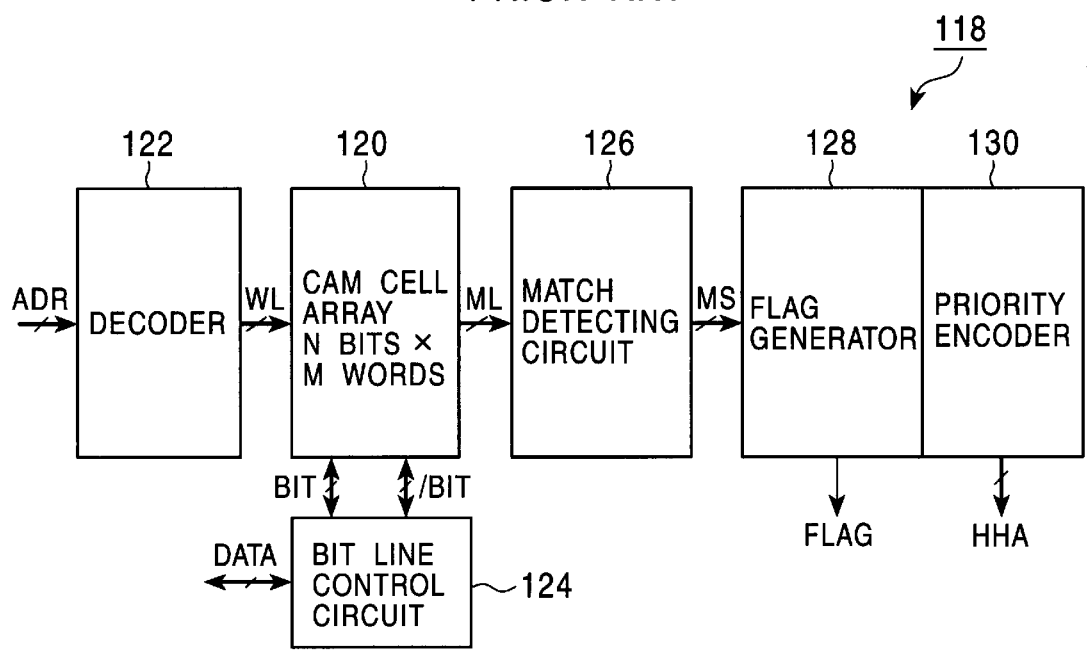
FIG. 17 is a block diagram of one example of the CAM device.

As is shown in the timing chart in FIG. 16, during the standby time, the search bit line control circuit 210a in FIG. 6 sets the signal SBITEQN to HIGH and sequentially sets the signals SBITPCN and SBITDCN to LOWS.

As a result, in the control circuit 218 of the search bit line SBIT, the output signal of the NAND gate 224 is HIGH, the output signal of the AND gate 226 is LOW, and the output signal of the inverter 228 is HIGH, turning on the NMOS 230 and turning off the PMOS 232. This electrically isolates the search bit line SBIT from the internal node SBITH and allows the search bit line SBIT to be discharged to the ground potential via the NMOS 230.

In the same manner, the control circuit 220 of the search bit bar line /SBIT electrically isolates the search bit bar line /SBIT from the internal node SBITH and allows the search bit bar line /SBIT to be discharged to the ground potential.

In the charge storage control circuit 222, turning on the PMOS 234 causes the potential of the capacitance component 236 to be charged while causing the internal node SBITH to be precharged to the power source potential.

On the other hand, during match searching, the signals SBITDCN and SBITPCN are set to HIGH, and then the signal SBITEQN is set to LOW.

At this time, in the control circuit 218 of the search bit line SBIT, the output signal of the NAND gate 224 is the complement of the signal ID. Therefore, when the signal ID is LOW, the NMOS 230 is maintained at the ON state; and when the signal ID is HIGH, the NMOS 230 is turned off, causing the search bit line SBIT to be in a floating LOW state of the ground potential to which the potential of SBIT is discharged at the standby time. At this point, the PMOS 232 is maintained at the OFF state.

In the control circuit 220 of the search bit bar line /SBIT, when the signal /ID is LOW (the signal ID is HIGH), the NMOS 230 is maintained at the ON state. When the signal /ID is HIGH (the signal ID is LOW), the NMOS 230 is turned OFF, causing the search bit bar line /SBIT to be in the floating LOW state of the ground potential to which the potential of /SBIT is discharged at the standby time.

In the charge storage control circuit 222, the PMOS 234 is turned off, causing the internal node SBITH to be in the floating HIGH state of the power source potential to which the potential of SBITH is precharged at the standby time.

Thereafter, when the signal SBITEQN is set to LOW, in the control circuit 218 of the search bit line SBIT, the output signal of the AND gate 226 becomes the complement of the output signal of the NAND gate, that is, the signal ID. The output of the inverter 228 becomes the complement of the input of the inverter 228.

Accordingly, when the signal ID is LOW, the PMOS 232 is turned off and the search bit line SBIT is maintained at a discharged state to the ground potential via the NMOS 230. When the signal ID is HIGH, the PMOS 232 is turned on, allowing the search bit line SBIT and the internal node SBITH to be electrically connected. This causes the potential of the search bit line SBIT to be an intermediate potential in a state in which charges of SBIT and SBITH are shared.

The situation of the control circuit 220 of the search bit bar line /SBIT is contrary to that of the control circuit 218 of the search bit line SBIT. That is, when the signal /ID is LOW (the signal ID is HIGH), the potential of the search bit bar line /SBIT becomes an intermediate potential in a state in which charges of /SBIT and SBITH are shared. When the signal /ID is HIGH (the signal ID is LOW), the search bit bar line /SBIT is maintained at the discharged state to the ground potential.

Figure 2:
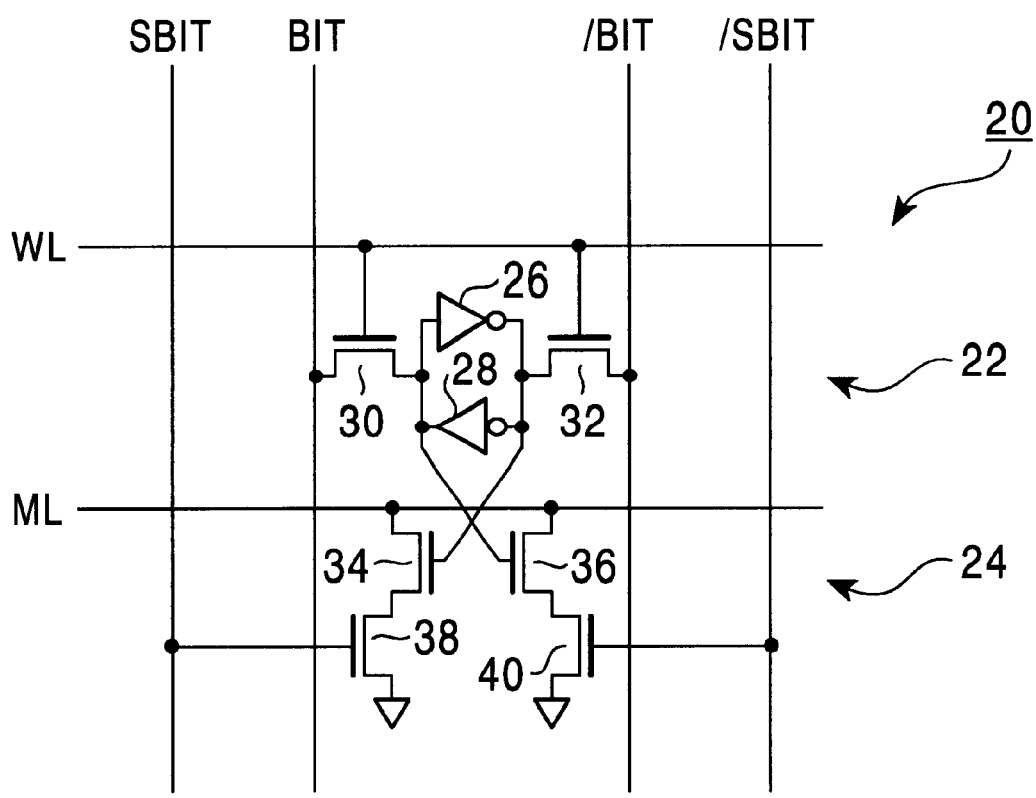
FIG. 2 is a circuit diagram of a CAM cell according to an embodiment of the present invention.

When match searching of the search bit line pair of SBIT and /SBIT is performed using, for example, the CAM cell 20 shown in FIG. 2 as the CAM cell 204, the potential of the search bit line pair of SBIT and /SBIT must be adjusted to be an intermediate potential between the threshold voltages of the NMOSs 38 and 40 and the power source potential by appropriately changing the capacitance of the capacitance component 236 so that the NMOSs 38 and 40 can be turned on. Search bit line control circuits 210b and 210c are adjusted in the same manner.

Alternatively, in the search bit line control circuit 210a, before equalization is performed, the polarity of the internal node SBITH and the polarities of SBIT and /SBIT of the search bit line pair may be inverted. That is, in this case, alternative may be made so that, as shown in the search bit line control circuit 210b in FIG. 7, the N-type MOS transistors and the P-type MOS transistors are switched, the power source and the ground are switched, and the polarity of each internal signal is inverted.

Figure 8:
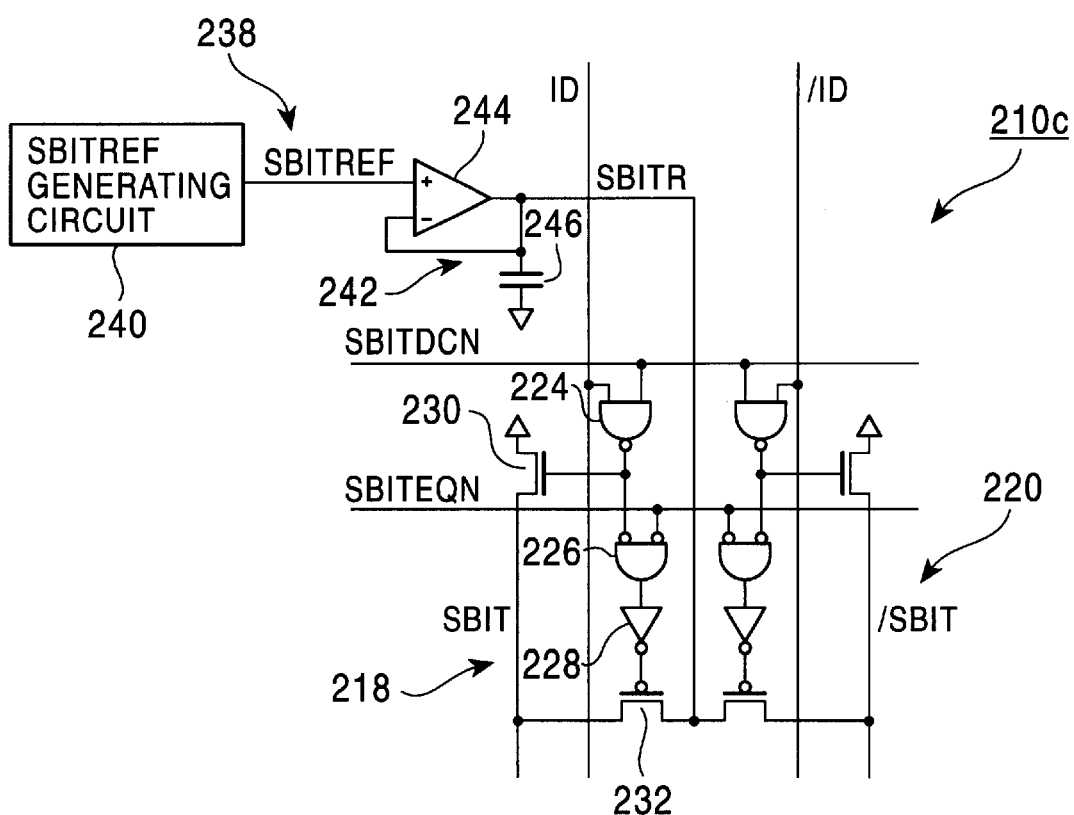
FIG. 8 is a circuit diagram of the search bit line control circuit according to another embodiment of the present invention.

The search bit line control circuit 210c in FIG. 8 internally generates an intermediate potential, and sets this internally generated potential to one of the search bit line pair of SBIT and /SBIT. Since this search bit line control circuit 210c differs from the search bit line control circuit 210a in FIG. 6 only in that the charge storage control circuit 222 is switched to a potential generating circuit 238, the potential generating circuit 238 is described.

In the search bit line control circuit 210c, the potential generating circuit 238 includes an SBITREF generating circuit 240 and a voltage generating circuit 242.

The SBITREF generating circuit 240 generates a voltage level that drives one of the search bit pair of SBIT and /SBIT during equalization.

The voltage generating circuit 242 outputs with an enhanced driving capability a potential which is generated by the SBITREF generating circuit 240 having a low driving capability. The voltage generating circuit 242 includes an operational amplifier 244 and a capacitance component 246. An SBITREF signal generated by the SBITREF generating circuit 240 is input to a "+" terminal of the operational amplifier 244 having a voltage-follower construction, and an internal node SBITR is connected to a "−" terminal thereof. The capacitance component 246 is connected between the internal node SBITR and the ground.

In this search bit line control circuit 210c, the SBITREF generating circuit 240 generates and outputs the potential to the internal node SBITREF, and the voltage generating circuit 242 amplifies an electric current driving capability. This outputs the potential having the amplified driving capability to the internal node SBITR. During match searching, the internal node SBITR and either SBIT or /SBIT are electrically connected in accordance with the voltage levels of the signals ID and /ID. Because of this, the potential of either SBIT or /SBIT that is electrically connected with the internal node SBITR, and is charged to the potential of the internal node SBITR.

In the CAM 200, the ML generating circuit 212 precharges the potential of the match line ML to an intermediate potential during match searching. In other words, during match searching, the amount of level swing in the potential of the match line ML is reduced by setting the potential of the match line ML to the intermediate potential.

Concrete examples of the ML level generating circuit 212 are described with reference to FIGS. 9, 10, 11, and 12.

Figure 9:
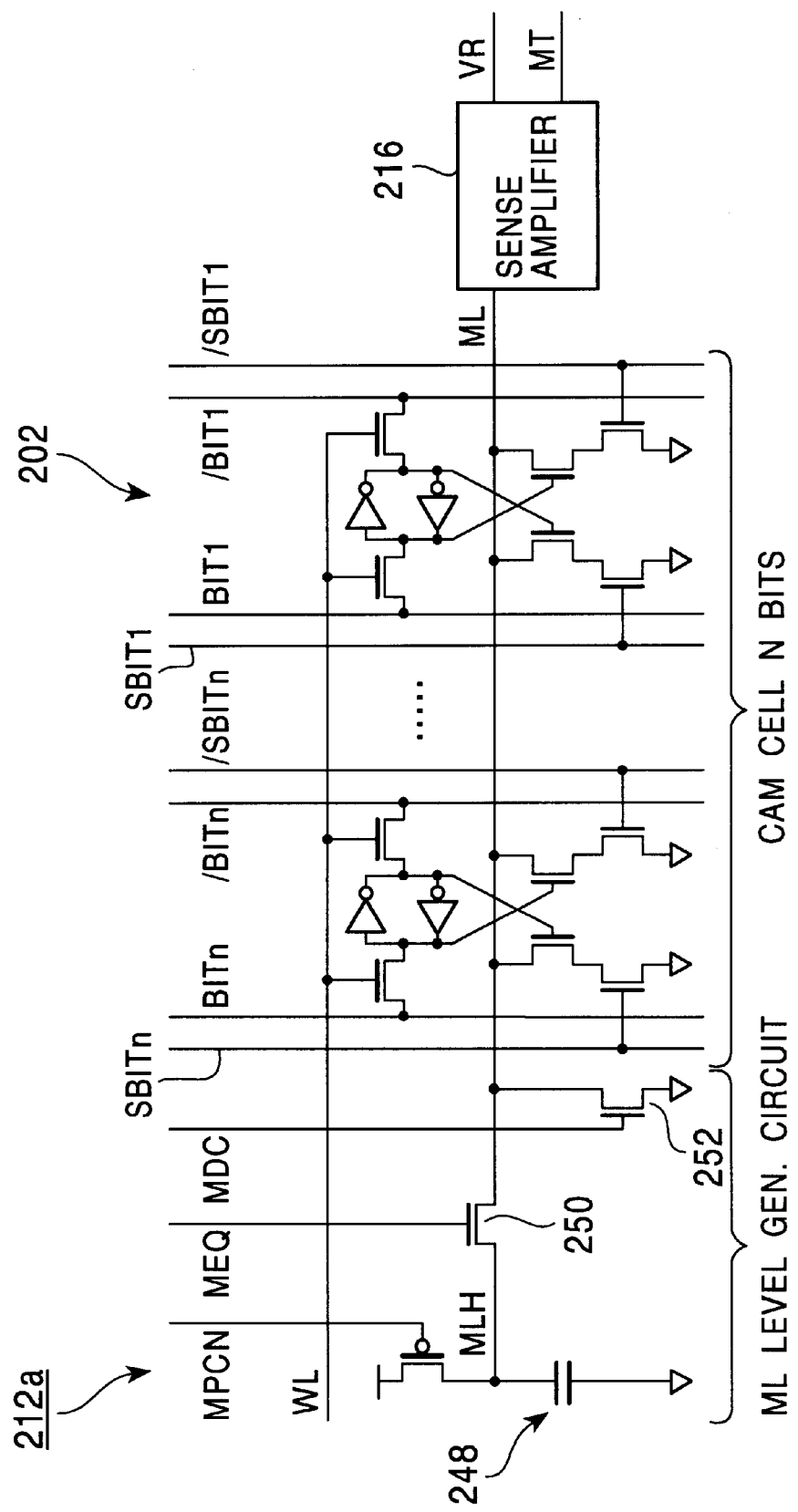
FIG. 9 is a circuit diagram of an ML level generating circuit according to one embodiment of the present invention.

An ML level generating circuit 212a in FIG. 9 sets the intermediate potential to the match line ML during match searching due to charge share with an internal node MLH. The ML level generating circuit 212a includes a potential storage control circuit 248, an equalizing NMOS 250, and a discharging NMOS 252.

The potential storage control circuit 248 differs from the charge storage control circuit 222 used in the search bit line control circuit 210a of the search bit line SBIT shown in FIG. 6 only in that the internal node MLH is provided instead of the internal node SBITH. Other than this, they have the same construction. The NMOS 252 is connected between the match line ML and the ground. A signal MDC is input to the gate of the NMOS 252. The NMOS 250 is connected between the internal node MLH and the match line ML. A signal MEQ is input to the gate of the NMOS 250.

The timing chart in FIG. 16 shows that, during the standby time, the signal MEQ is set to LOW and then the signal MPCN is set to LOW as well as the signal MDC to HIGH.

Therefore, the NMOS 250 is turned off, isolating the internal node MLH from the match line ML. This causes the potential storage control circuit 248 to precharge the potential of the internal node MLH to the power source potential while the potential of the match line ML is discharged to the ground potential via the NMOS 252.

During match searching, initially, the signals MPCN and MDC are set to HIGH and LOW, respectively. Thereafter the signal MEQ is set to HIGH.

Therefore, the internal node MLH is in the floating-HIGH state of the power source potential to which the potential of the internal node MLH is precharged at the standby time while the match line ML is in the floating-LOW state of the ground potential to which the potential of the match line ML is discharged during the standby time.

Thereafter, the signal MEQ is set to HIGH, turning on the NMOS 250. This establishes an electrical connection between the internal node MLH and the match line ML, which causes the potential of the match line ML to be an intermediate potential of a state in which charges of the match line ML and the internal node MLH are shared.

The potential of the HIGH level of the match line ML during match searching must be adjusted by appropriately changing the capacitance of the potential storage control circuit 248 so as to be an intermediate potential between the below-described reference voltage VR and the power source potential. The following ML level generating circuits 212b, 212c, and 212d are adjusted in the same manner.

Figure 10:
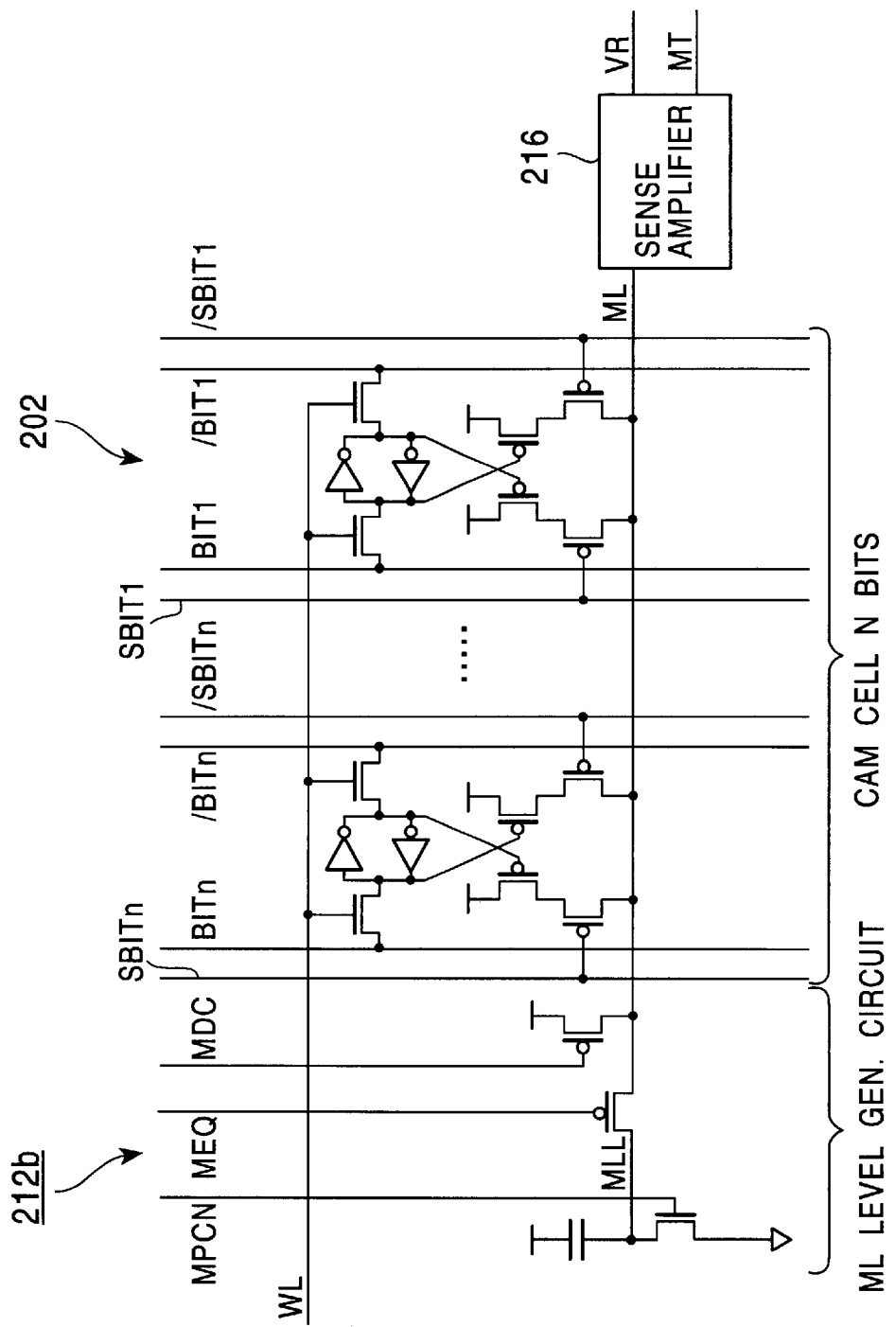
FIG. 10 is a circuit diagram of the ML level generating circuit according to another embodiment of the present invention.

An alternative of the ML level generating circuit 212a is constructed, for example, as shown in the ML level generating circuit 212b in FIG. 10, the N-type MOS transistors and the P-type MOS transistors are switched, the power sources and the grounds are switched, and the polarity of each internal signal is inverted.

That is, in the ML level generating circuit 212b, the potential of the LOW level of the match line ML must be adjusted by appropriately changing the capacitance of the potential storage control circuit so as to be an intermediate potential between the below-described reference voltage VR and the ground potential.

Figure 11:
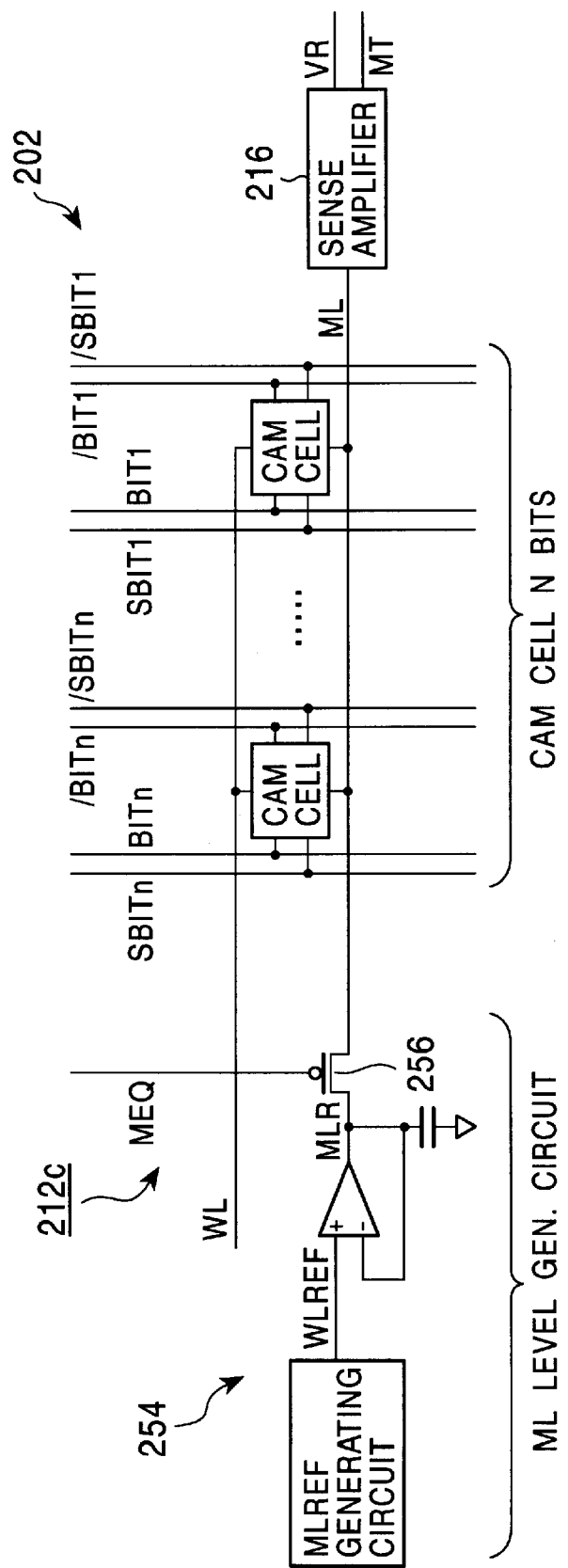
FIG. 11 is a circuit diagram of the ML level generating circuit according to another embodiment of the present invention.
Figure 12:
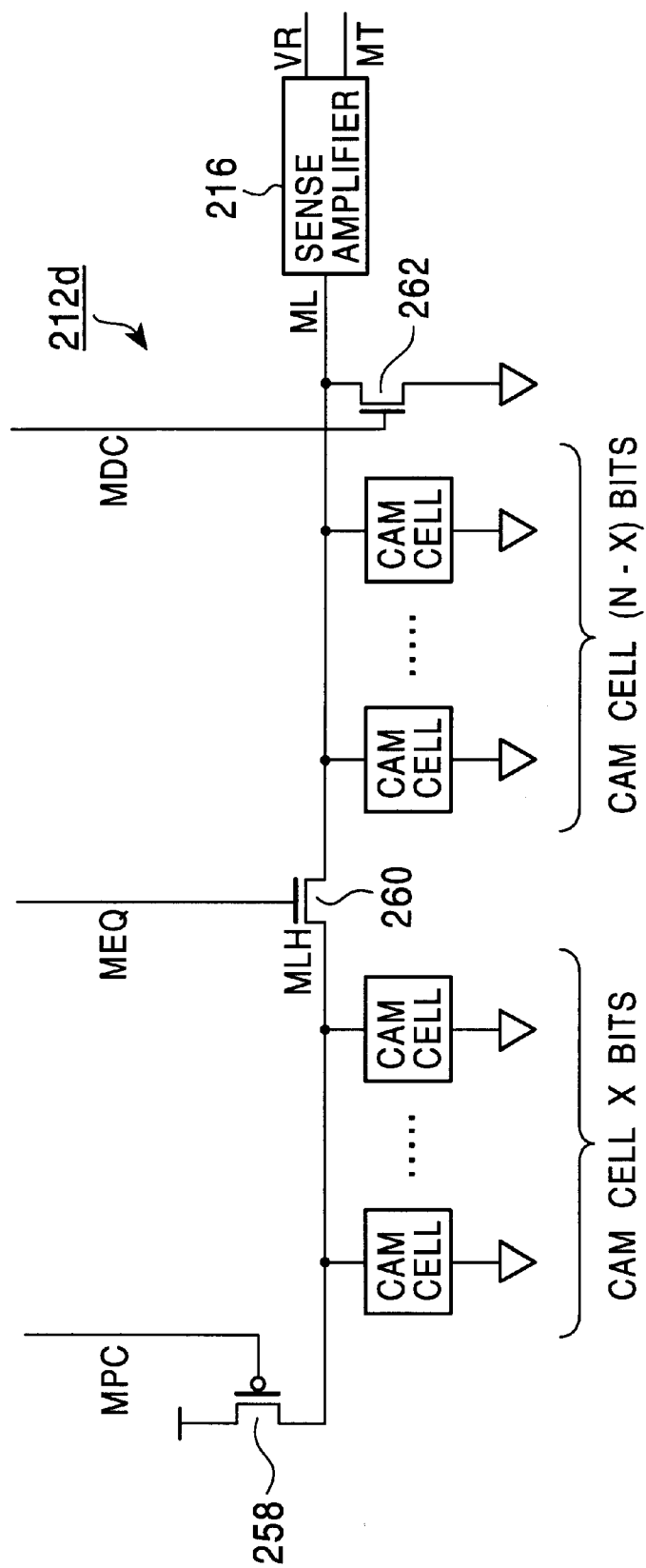
FIG. 12 is a circuit diagram of the ML level generating circuit according to another embodiment of the present invention.

The ML level generating circuit 212c shown in FIG. 11 internally generates an intermediate potential and then allows the internally generated potential to be applied to the match line ML, whereby the potential of the match line ML is set to the intermediate potential. The ML level generating circuit 212c includes a potential generating circuit 254 and an equalizing PMOS 256.

The potential generating circuit 254 differs from the potential generating circuit 238 used in the search bit line control circuit 210c shown in FIG. 8 in that a MLREF generating circuit is provided instead of the SBITREF generating circuit 240 and internal nodes MLREF and MLR are provided instead of the internal nodes SBITREF and SBITR. Other than these, they are identical. The PMOS 256 is connected between the internal node MLR and the match line ML. The signal MEQ is input to the gate of the PMOS 256.

The ML level generating circuit 212c outputs the potential generated by the potential generating circuit 254 to the internal node MLR. The potential of the equalized match line ML is charged to the potential of the internal node MLR.

The ML level generating circuit 212d includes a precharging PMOS 258, an equalizing NMOS 260 and a discharging NMOS 262. The equalizing NMOS 260 is connected to two sections: a first section in which X bits of CAM cells are connected to the internal node MLH and a second section in which (N–X) bits of CAM cells are connected to the match line ML. Charge share between the first and second sections sets the potential of the match line ML during match searching as the intermediate potential.

The PMOS 258 is connected between the power source and the internal node MLH. The signal MPC is input to the gate of the PMOS 258. The NMOS 260 is connected between the internal node MLH and the match line ML. The signal MEQ is input to the gate of the NMOS 260. The NMOS 262 is connected between the match line ML and the ground. The signal MDC is input to the gate of the NMOS 262. The internal node MLH is connected to the X bits of CAM cells while the match line ML is connected to (N–X) bits of CAM cells.

In the ML level generating circuit 212d, during standby time, after the signal MEQ is set to LOW, the signals MPC and MDC are set to LOW and HIGH, respectively.

As a result, the NMOS 260 is turned off, isolating the internal node MLH from the match line ML. This allows the potential of the internal node MLH to be precharged to the power source potential via the PMOS 258 while allowing the potential of the match line ML to be discharged to the ground potential via the NMOS 262.

When match searching is performed, initially, the signals MPC and MDC are set to HIGH and LOW, respectively, and then the signal MEQ is set to HIGH.

Accordingly, the potential of the internal node MLH is in the floating-HIGH state of the power source potential to which the potential of MLH is precharged during the standby time while the potential of the match line ML is in the floating-LOW state of the ground potential to which the potential of the match line ML is discharged during the standby time.

Thereafter, the signal MEQ becomes HIGH, turning on the NMOS 260. This establishes an electrical connection between the internal node MLH and the match line ML, whereby the potential of the match line ML becomes the intermediate potential in a state in which charges of the internal node MLH and the match line ML are shared.

In the ML level generating circuit 212d, the intermediate potential level of the equalized match line ML can be appropriately altered by appropriately changing the number of CAM cells connected to the internal node MLH and the match line ML.

In the CAM 200 shown in FIG. 5, the reference voltage generating circuit 214 generates the reference voltage VR for detecting the potential of the match line ML after match searching.

Concrete examples of the reference voltage generating circuit 214 are described with reference to FIGS. 13, 14, and 15.

Figure 13:
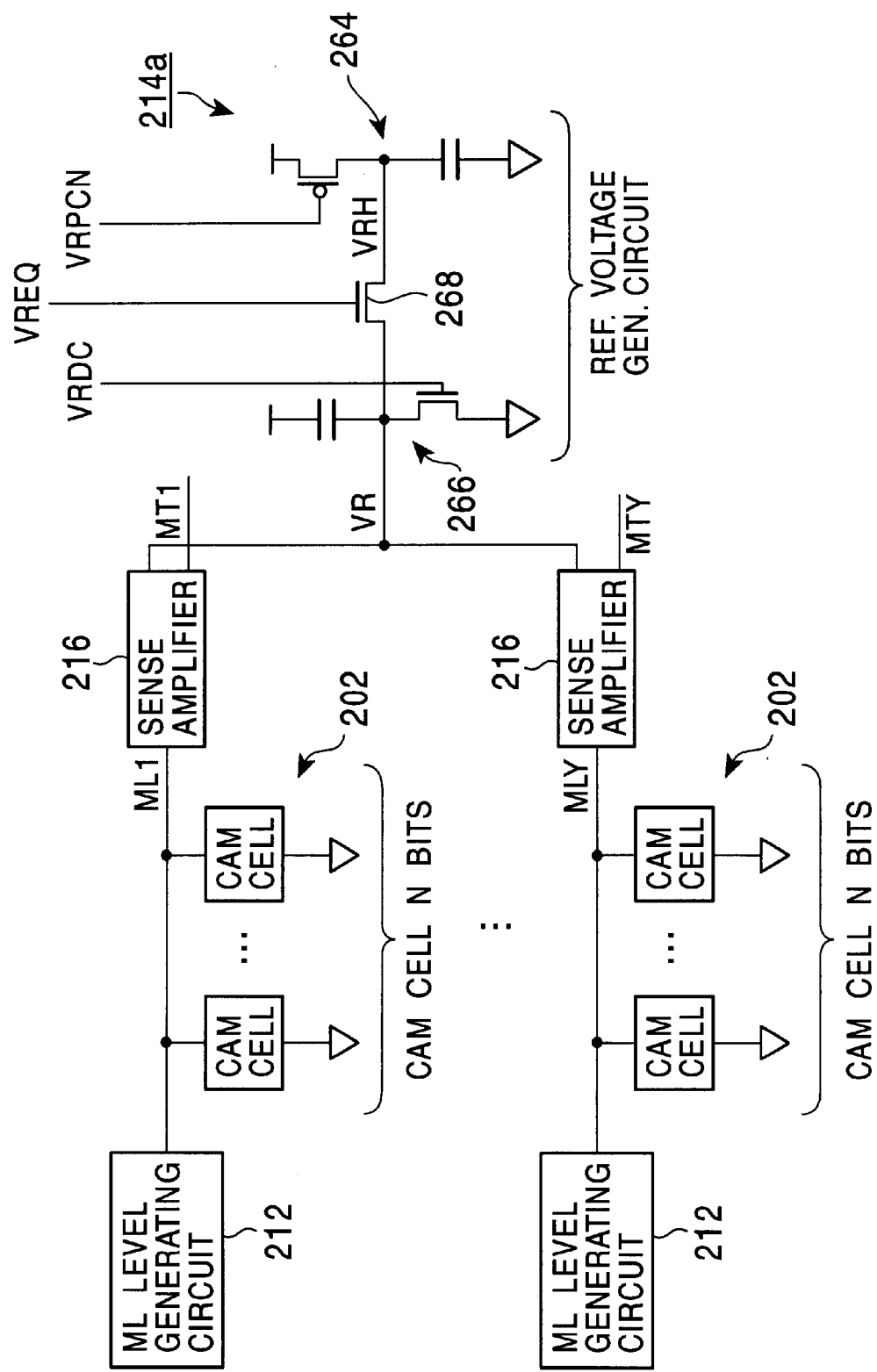
FIG. 13 is a circuit diagram of a reference voltage generating circuit according to one embodiment of the present invention.

In FIG. 13, a reference voltage generating circuit 214a generates the reference voltage VR of the intermediate potential by charging the two internal nodes VR and VRH and sharing therebetween. The reference voltage generating circuit 214a includes potential storage control circuits 264 and 266 and an equalizing NMOS 268.

Figure 7:
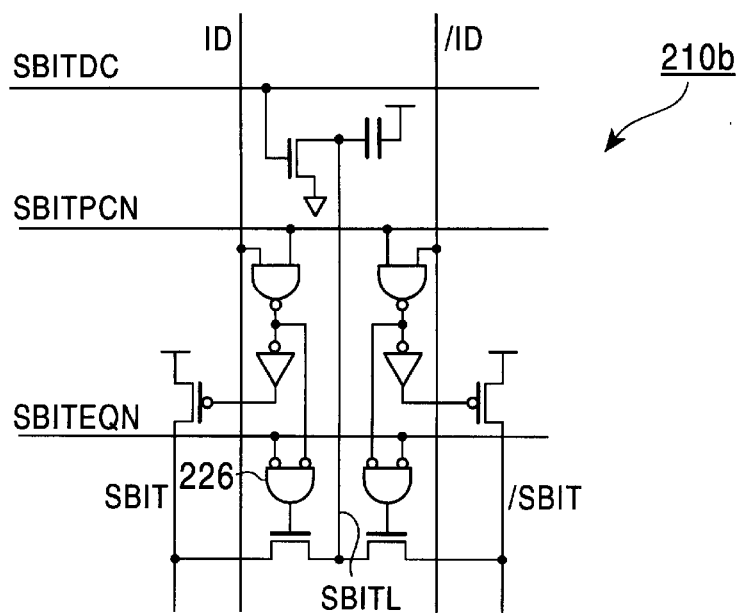
FIG. 7 is a circuit diagram of the search bit line control circuit according to another embodiment of the present invention.

The potential storage control circuits 264 and 266 differ from the control circuits 218 and 220 used in the search bit line control circuits 210a and 210b in FIGS. 6 and 7, respectively, in that the internal nodes VRH and VR are provided instead of the internal nodes SBITH and SBITL, respectively, and signals VRPCN and VRDC are provided instead of the signals SBITPCN and SBITDC, respectively.

Other than these, they are identical. The NMOS 268 is connected between the internal nodes VHR and VR and a signal VREQ is input to the gate of the NMOS 268.

The timing chart in FIG. 16 shows that, in the reference voltage generating circuit 214a in FIG. 13, during the standby time, the signal VREQ is set to LOW and then the signals VRPCN and VRDC are set to LOW and HIGH, respectively.

As a result, the NMOS 268 is turned off, isolating the internal node VRH from the internal node VR. This causes the potential storage control circuit 264 to precharge the potential of the internal node VRH to the power source potential while causing the potential storage control circuit 266 to discharge the internal node VR to the ground potential.

During match searching, initially, the signals VRPCN and VRDC are set to HIGH and to LOW, respectively, and then the signal VREQ is set to HIGH.

Accordingly, the internal node VRH is in the floating-HIGH state of the power source potential to which the potential of VRH is precharged during the standby time and the internal node VR is in the floating-LOW state of the ground potential to which the potential of VR is discharged during the standby time.

The signal VREQ is set to HIGH, turning on the NMOS 268. This allows the internal nodes VRH and VR to be electrically connected, whereby the potential of the internal node VR becomes an intermediate potential in a state in which charges of the internal nodes VRH and VR are shared.

During match searching, the reference voltage must be adjusted by appropriately changing the capacitances of the potential storage control circuit 264 and 266 so as to be an intermediate potential between the potential of the HIGH level of the above-described match line ML during match searching and the ground potential. The following reference voltage generating circuits 214b and 214c are also similar to the reference voltage generating circuit 214a.

Figure 14:
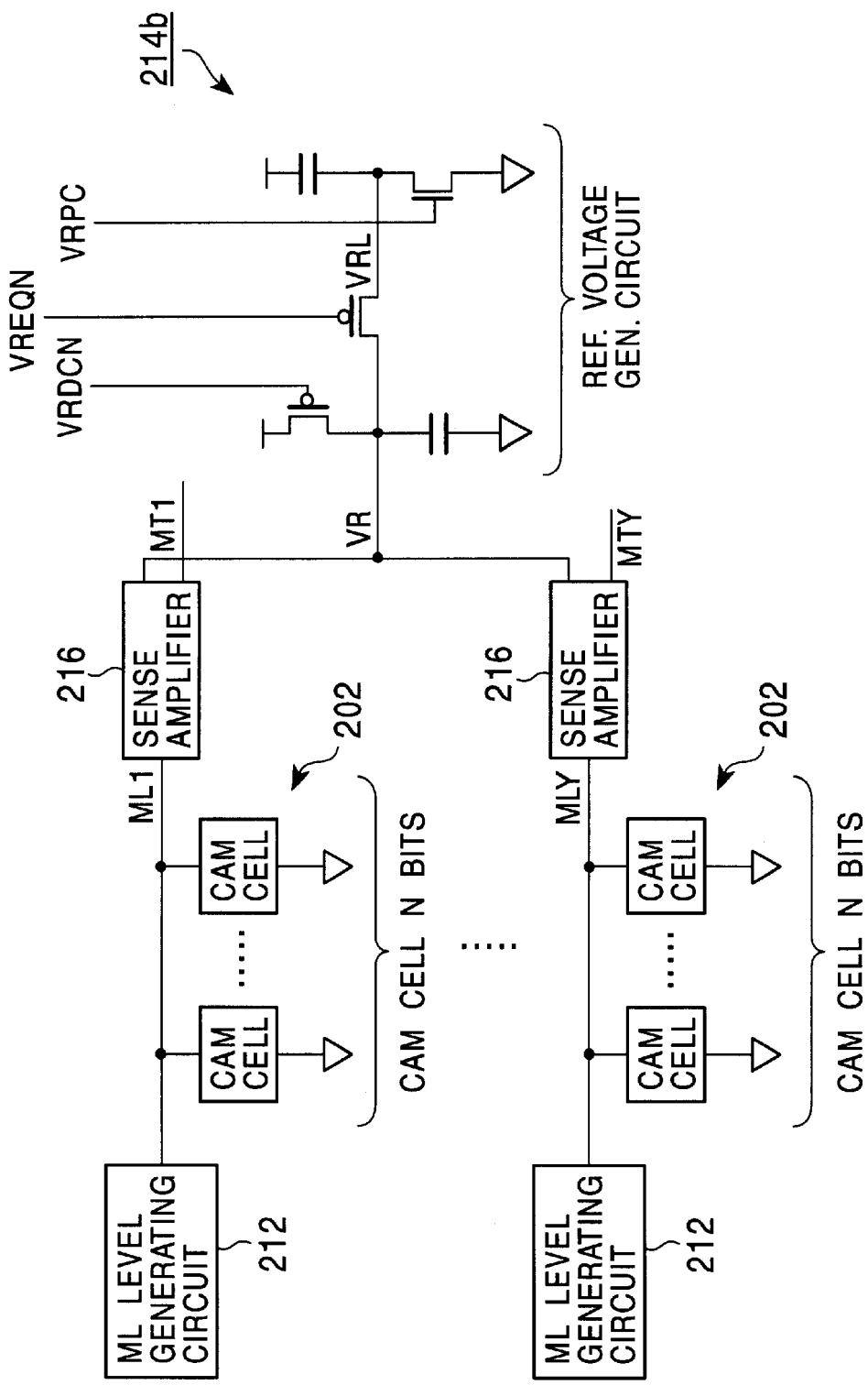
FIG. 14 is a circuit diagram of the reference voltage generating circuit according to another embodiment of the present invention.

The alternative of the reference voltage generating circuit 214a may be constructed so that, for example, as shown in the reference voltage generating circuit 214b in FIG. 14, the NMOS transistors and the PMOS transistors are switched, the power source and the ground are switched, and the polarity of each internal signal is inverted.

That is, in the reference voltage generating circuit 214b, the potential of the reference voltage during match searching must be adjusted by appropriately changing the capacitance of the potential storage control circuit so as to be an intermediate potential between the LOW level potential of the match line ML during match searching and the power source potential.

Figure 15:
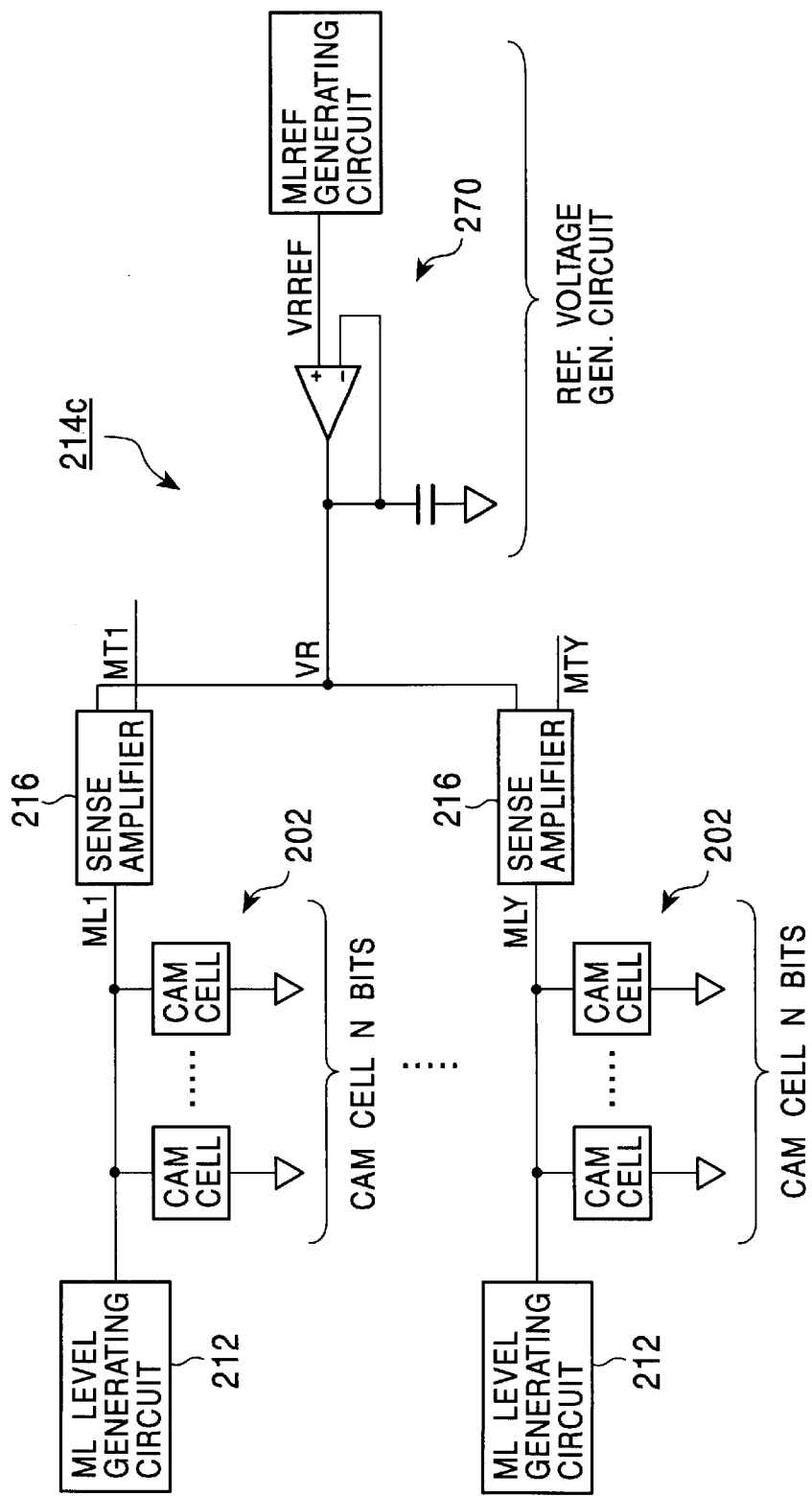
FIG. 15 is a circuit diagram of the reference voltage generating circuit according to another embodiment of the present invention.

The reference voltage generating circuit 214c shown in FIG. 15 internally generates the intermediate voltage and includes a potential generating circuit 270.

In this reference voltage generating circuit 214c, the generated potential VRREF is output to the internal node VR, and the internal node VR is charged to the potential VRREF.

Finally, in the CAM 200 shown in FIG. 5, the sense amplifier 216 detects the potential of the match line ML based on the reference voltage VR and amplifies the detected differential potential to output. Preferably, the sense amplifier 216 causes the output voltage level in the standby state and a match sense output MT at mismatching in the match searching state to be identical, so that reduction in power consumption can be achieved because mismatching is detected in most words of the CAM 200 as a result of match searching.

When storage data is written in the CAM 200, the address decoder 206 drives the word line corresponding to an address signal and the storage bit line control circuit 208 drives the data on the storage bit line pair of BIT and /BIT. The data driven on the storage bit line pair of BIT and /BIT is written to the word selected by the word line corresponding to the address signal.

When storage data is read, the address decoder 206 drives the word line corresponding to an address signal. The storage data which is stored in the word selected by the word line corresponding to this address signal and the storage data bar which is the complement of the storage data are output to BIT and /BIT, respectively, of the storage bit line pair.

During match searching, the search bit line control circuit 210 sets the potentials of the search bit line pair of SBIT and /SBIT in accordance with the voltage level of the signal ID applied from the outside of the CAM 200 in which the potential of one of the search bit line pair is set to HIGH (the intermediate potential) and the potential of the other is set to LOW (the ground potential). In the present embodiment, the ML level generating circuit 212 sets the potential of the match line ML to HIGH (the intermediate potential).

As a result of match searching, only when matching of the storage data with the match data is detected with respect to all bits of CAM cells 204 corresponding to the N bits of one word and connected to the match line ML, the potential of the match line is maintained at HIGH (the intermediate potential) to which the potential of the match line ML is precharged before match searching. In other words, when mismatching is detected even in one bit among the CAM cells 204 corresponding to the N bits of the word, the potential of the match line ML becomes LOW (the ground potential).

The reference voltage generating circuit 214 generates the reference voltage VR. After match searching, the sense amplifier 216 compares the voltage level of the match line ML with the reference voltage VR and outputs the comparison result as the match sense output MT. In the present embodiment, as is shown in the timing chart in FIG. 16, the match sense output MT is LOW in the standby state and at mismatching in the match searching state, and HIGH at matching in the match searching state.

The construction of the capacitance component used in the CAM 200 is not restricted. The capacitance component is obtained using, for example, the gate capacitance of the MOS transistor, the capacitance using metal wiring, polysilicon, or the like, the junction capacitance of a p-n junction, or the like may be available. Alternatively, the CAM cell 204 may be used as a dummy capacitance component.

The CAM device according to the present invention is not limited to the foregoing embodiments. Many apparently widely different embodiments of the present invention may be made without departing from the spirit and scope thereof.

In the CAM device according to the present invention, the small swing of the level of the search bit line pair is realized by independently wiring each of the storage bit line pair and the search bit line pair, and then setting the level of the search bit line pair or the precharge level of the match line to the intermediate potential.

In the CAM device according to the present invention, since the load capacitance of the search bit line pair is reduced by independently wiring of the storage bit line pair and since the smaller swing in the level of the search bit line pair is realized, the amount of power consumption during match searching can be greatly reduced. This enables the CAM device to have higher capacity and faster processing speed. Furthermore, since the smaller swing in the precharge level of the match line is realized, the present invention enables the power consumption during match searching to be greatly reduced. In addition, by using the charge transfer amplifier which can rapidly change the sense node for match detecting in accordance with even a small amount of decrease in the voltage of the match line by redistributing electrical charge, the acceleration of match detecting is achieved.

What is claimed is:

1. A content addressable memory device comprising:
   a storage bit line pair for reading storage data from and writing storage data to a content addressable memory cell;
   a search bit line pair, wired independently from said storage bit line pair, for providing search data to said content addressable memory cell; and
   first means for realizing a smaller swing in the level of said search bit line pair by setting the potential of said search bit line pair to an intermediate potential between a power source potential and a ground potential during match searching.

2. A content addressable memory device according to claim 1, wherein:
   during a standby time, said first means electrically isolates said storage bit line pair from said search bit line pair and sets a precharge potential of said storage bit line pair and of said search bit line pair so that the polarities of the precharge potentials thereof are opposite to each other; and
   when the potential of said search bit line pair is set to said intermediate potential during match searching, said first means electrically connects one of said search bit line pair to one of said storage bit line pair corresponding to said search bit line pair.

3. A content addressable memory device according to claim 1, wherein:
   said first means comprises a capacitance component;
   during a standby time, said first means electrically isolates said search bit line pair from said capacitance component and causes said capacitance component to store the potential having the opposite polarity of the precharge potential of said search bit line pair; and
   when the potential of said search bit line pair is set to said intermediate potential during match searching, said first means electrically connects one of said search bit line pair to said capacitance component.

4. A content addressable memory device according to claim 1, wherein:
   said first means comprises intermediate potential generating means;
   during a standby time, said first means electrically isolates the intermediate potential generating means from said search bit line pair; and
   when the potential of said search bit line pair is set to said intermediate potential during match searching, said first means electrically connects the intermediate potential generating means to one bit line of said search bit line pair.

5. A content addressable memory device comprising:
   a storage bit line pair for reading storage data from and writing storage data to a content addressable memory cell;
   a search bit line pair, wired independently from said storage bit line pair, for providing search data to said content addressable memory cell; and second means for realizing a smaller swing in the level of a match line by setting a precharge potential of said match line to an intermediate potential between a power source potential and a ground potential, wherein said match line outputs a result of match searching of said storage data for said search data.

6. A content addressable memory device according to claim 5, wherein:

said second means comprises:
a first transistor, connected between said match line and a sense node, serving as a charge transfer amplifier, the ON/OFF state thereof being controlled in accordance with the level of a clamping voltage; and
precharge means for precharging the potential of said sense node; and
the potential of said match line is precharged by said precharge means via said first transistor to an intermediate potential.

7. A content addressable memory device according to claim 5, wherein:

said second means comprises:
a first transistor, connected between said match line and a sense node, serving as a charge transfer amplifier, the ON/OFF state thereof being controlled in accordance with the level of a clamping voltage;
a second transistor for precharging said match line;
precharge means for precharging said sense node; and
a clamping-voltage control circuit for controlling the level of said clamping voltage; and
independent of the level of said clamping voltage, the potential of said match line is precharged by said second transistor to an intermediate potential which is at least an amount corresponding to the threshold voltage of said second transistor below said power source potential or to an intermediate potential which is at least an amount corresponding to the threshold voltage of said second transistor above said ground potential.

8. A content addressable memory device according to claim 5, wherein:

said second means comprises:
a first transistor, connected between said match line and a sense node, serving as a charge transfer amplifier, the ON/OFF state thereof being controlled in accordance with the level of a clamping voltage;
a second transistor for precharging said match line to generate said clamping voltage; and
precharge means for precharging said sense node;
the potential of said match line is precharged by at least said second transistor to an intermediate potential which is at least an amount corresponding to the threshold voltage of said second transistor below said power source potential or to an intermediate potential which is at least an amount corresponding to the threshold voltage of said second transistor above said ground potential; and
said second transistor sets said clamping voltage so that said clamping voltage is the same potential as the precharge voltage of said match line.

9. A content addressable memory device according to claim 5, wherein:

said second means comprises a capacitance component;
during a standby time, said second means electrically isolates said match line from said capacitance component and causes said capacitance component to store the potential having the opposite polarity of the precharge potential of said match line; and
when the potential of said match line is set to said intermediate potential during match searching, said second means generates said intermediate potential by electrically connecting said match line to said capacitance component.

10. A content addressable memory device according to claim 5, wherein:

said second means comprises intermediate potential generating means;
during a standby time, said second means electrically connects the intermediate potential generating means to said match line; and
during match searching, said second means electrically isolates the intermediate potential generating means from said match line and set the potential of said match line to said intermediate potential.

11. A content addressable memory device according to claim 5, wherein:

among a group of the content addressable memory cells constituting a word, said second means causes a match output of the content addressable memory cells corresponding to a predetermined number of bits of said word to be connected to an internal node while causing a match output of the rest of the content addressable memory cells to be connected to said match line;
during a standby time, said second means electrically isolates said internal node from said match line and sets the precharge potentials of said internal node and of said match line so that the polarities of the precharge potentials thereof are opposite to each other; and
when the polarity of said match line is set to said intermediate potential during match searching, said second means generates said intermediate potential by electrically connecting said internal node to said match line.

12. A content addressable memory device comprising:

a storage bit line pair for reading storage data from and writing storage data to a content addressable memory cell;
a search bit line pair, wired independently from said storage bit line pair, for providing search data to said content addressable memory cell;
first means for realizing a smaller swing in the level of said search bit line pair by setting the potential of said search bit line pair to an intermediate potential between a power source potential and a ground potential during match searching; and
second means for realizing a smaller swing in the level of a match line by setting a precharge potential of said match line to an intermediate potential between said power source potential and said ground potential, wherein said match line outputs a result of match searching of said storage data for said search data.

13. A content addressable memory device according to claim 12, wherein:

during a standby time, said first means electrically isolates said storage bit line pair from said search bit line pair and sets a precharge potential of said storage bit line pair and of said search bit line pair so that the polarities of the precharge potentials thereof are opposite to each other; and
when the potential of said search bit line pair is set to said intermediate potential during match searching, said first means electrically connects one of said search bit line pair to one of said storage bit line pair corresponding to said search bit line pair.

14. A content addressable memory device according to claim 12, wherein:
   said first means comprises a capacitance component;
   during a standby time, said first means electrically isolates said search bit line pair from said capacitance component and causes said capacitance component to store the potential having the opposite polarity of the precharge potential of said search bit line pair; and
   when the potential of said search bit line pair is set to said intermediate potential during match searching, said first means electrically connects one of said search bit line pair to said capacitance component.

15. A content addressable memory device according to claim 12, wherein:
   said first means comprises intermediate potential generating means;
   during a standby time, said first means electrically isolates the intermediate potential generating means from said search bit line pair; and
   when the potential of said search bit line pair is set to said intermediate potential during match searching, said first means electrically connects the intermediate potential generating means to one bit line of said search bit line pair.

16. A content addressable memory device according to claim 12, wherein:
   said second means comprises:
      a first transistor, connected between said match line and a sense node, serving as a charge transfer amplifier, the ON/OFF state thereof being controlled in accordance with the level of a clamping voltage; and
      precharge means for precharging the potential of said sense node; and
   the potential of said match line is precharged by said precharge means via said first transistor to an intermediate potential.

17. A content addressable memory device according to claim 12, wherein:
   said second means comprises:
      a first transistor, connected between said match line and a sense node, serving as a charge transfer amplifier, the ON/OFF state thereof being controlled in accordance with the level of a clamping voltage;
      a second transistor for precharging said match line;
      precharge means for precharging said sense node; and
      a clamping-voltage control circuit for controlling the level of said clamping voltage; and
   independent of the level of said clamping voltage, the potential of said match line is precharged by said second transistor to an intermediate potential which is at least an amount corresponding to the threshold voltage of said second transistor below said power source potential or to an intermediate potential which is at least an amount corresponding to the threshold voltage of said second transistor above said ground potential.

18. A content addressable memory device according to claim 12, wherein:
   said second means comprises:
      a first transistor, connected between said match line and a sense node, serving as a charge transfer amplifier, the ON/OFF state thereof being controlled in accordance with the level of a clamping voltage;
      a second transistor for precharging said match line to generate said clamping voltage; and
      precharge means for precharging said sense node;
   the potential of said match line is precharged by at least said second transistor to an intermediate potential which is at least an amount corresponding to the threshold voltage of said second transistor below said power source potential or to an intermediate potential which is at least an amount corresponding to the threshold voltage of said second transistor above said ground potential; and
   said second transistor sets said clamping voltage so that said clamping voltage is the same potential as the precharge voltage of said match line.

19. A content addressable memory device according to claim 12, wherein:
   said second means comprises a capacitance component;
   during a standby time, said second means electrically isolates said match line from said capacitance component and causes said capacitance component to store the potential having the opposite polarity of the precharge potential of said match line; and
   when the potential of said match line is set to said intermediate potential during match searching, said second means generates said intermediate potential by electrically connecting said match line to said capacitance component.

20. A content addressable memory device according to claim 12, wherein:
   said second means comprises intermediate potential generating means;
   during a standby time, said second means electrically connects the intermediate potential generating means to said match line; and
   during match searching, said second means electrically isolates the intermediate potential generating means from said match line and set the potential of said match line to said intermediate potential.

21. A content addressable memory device according to claim 12, wherein:
   among a group of the content addressable memory cells constituting a word, said second means causes a match output of the content addressable memory cells corresponding to a predetermined number of bits of said word to be connected to an internal node while causing a match output of the rest of the content addressable memory cells to be connected to said match line;
   during a standby time, said second means electrically isolates said internal node from said match line and sets the precharge potentials of said internal node and of said match line so that the polarities of the precharge potentials thereof are opposite to each other; and
   when the polarity of said match line is set to said intermediate potential during match searching, said second means generates said intermediate potential by electrically connecting said internal node to said match line.

22. A content addressable memory device according to claim 12, further comprising:
   third means for generating a reference voltage for detecting the potential of said match line after match searching; and
   a sense amplifier for sensing the potential of said match line based on said reference voltage after match searching and amplifying to output the sensed potential as a match sense output.

23. A content addressable memory device according to claim 22, wherein:
   said third means comprises a first capacitance component and a second capacitance component;

during the standby time, said third means electrically isolates said first capacitance component from said second capacitance component and causes each of said first capacitance component and said second capacitance component to store the potential whose polarity is opposite to each other; and during match searching, said third means electrically connects said first capacitance component to said second capacitance component.

* * * * *